(12) United States Patent
Han et al.

(10) Patent No.: US 12,236,891 B2
(45) Date of Patent: Feb. 25, 2025

(54) SHIFT REGISTER FOR DISPLAY GATE DRIVER WITH SILICON AND OXIDE SEMICONDUCTOR TRANSISTORS

(71) Applicant: Honor Device Co., Ltd., Shenzhen (CN)

(72) Inventors: Linhong Han, Shenzhen (CN); Wanming Wu, Beijing (CN); Di Geng, Beijing (CN); Ling Li, Beijing (CN); Zheng Tian, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/271,467

(22) PCT Filed: Jan. 4, 2023

(86) PCT No.: PCT/CN2023/070297
§ 371 (c)(1),
(2) Date: Jul. 10, 2023

(87) PCT Pub. No.: WO2023/207216
PCT Pub. Date: Nov. 2, 2023

(65) Prior Publication Data
US 2024/0379064 A1    Nov. 14, 2024

(30) Foreign Application Priority Data

Apr. 27, 2022 (CN) .......................... 202210449955.X

(51) Int. Cl.
*G09G 3/32* (2016.01)
*G09G 3/3233* (2016.01)
(Continued)

(52) U.S. Cl.
CPC ......... *G09G 3/3266* (2013.01); *G09G 3/3233* (2013.01); *G11C 19/28* (2013.01);
(Continued)

(58) Field of Classification Search
CPC ......... G09G 3/3266; G09G 2310/0286; G11C 19/28
See application file for complete search history.

(56) References Cited

U.S. PATENT DOCUMENTS 11,043,168 B2    6/2021   Zhang et al.
11,663,976 B2    5/2023   Yao et al.
(Continued)

FOREIGN PATENT DOCUMENTS

CN    109616056 A    4/2019
CN    110517633 A    11/2019
(Continued)

*Primary Examiner* — Liliana Cerullo
(74) *Attorney, Agent, or Firm* — Leydig, Voit & Mayer, Ltd.

(57) ABSTRACT

This application provides a shift register, a gate drive circuit, a display panel, and an electronic device. The shift register includes: a node control module, electrically connected to a first level signal receive end that receives a low level, a second level signal receive end that receives a high level, a first clock signal end, a second clock signal end, a first node, and a second node; an input module, electrically connected to the second clock signal end, a trigger signal input end, and the second node; a voltage regulator module, electrically connected to the second node, a third node, and the second clock signal end; and an output module, electrically connected to the first level signal receive end, the second level signal receive end, a drive signal output end, the first node, and the third node.

14 Claims, 19 Drawing Sheets

(51) Int. Cl.
    *G09G 3/3266*     (2016.01)
    *G11C 19/28*     (2006.01)

(52) U.S. Cl.
    CPC ............... *G09G 2300/0819* (2013.01); *G09G 2300/0842* (2013.01); *G09G 2300/0861* (2013.01); *G09G 2310/0286* (2013.01)

(56) References Cited

U.S. PATENT DOCUMENTS

| | | |
|---|---|---|
| 2016/0217870 A1 | 7/2016 | Tseng et al. |
| 2017/0162145 A1 | 6/2017 | Huang et al. |
| 2017/0186362 A1* | 6/2017 | Shim .................... G09G 3/3266 |
| 2019/0197956 A1* | 6/2019 | Wu .......................... G09G 3/20 |
| 2020/0066209 A1 | 2/2020 | Zhang et al. |
| 2020/0184922 A1* | 6/2020 | Yang ...................... G09G 5/006 |
| 2020/0294461 A1 | 9/2020 | Xu et al. |
| 2021/0193050 A1 | 6/2021 | Yuan et al. |
| 2021/0407360 A1 | 12/2021 | Cheng |
| 2022/0013071 A1 | 1/2022 | Shi et al. |
| 2024/0029609 A1* | 1/2024 | Cao ...................... G09G 3/3266 |

FOREIGN PATENT DOCUMENTS

| | | |
|---|---|---|
| CN | 110689848 A | 1/2020 |
| CN | 110739020 A | 1/2020 |
| CN | 111754915 A | 10/2020 |
| CN | 112397008 A | 2/2021 |
| CN | 112838109 A | 5/2021 |
| CN | 113421604 A | 9/2021 |
| CN | 113889022 A | 1/2022 |
| CN | 113920924 A | 1/2022 |

\* cited by examiner

SHIFT REGISTER FOR DISPLAY GATE DRIVER WITH SILICON AND OXIDE SEMICONDUCTOR TRANSISTORS

CROSS-REFERENCE TO RELATED APPLICATIONS

This application is a national stage of International Application No. PCT/CN2023/070297, filed on Jan. 4, 2023, which claims priority to Chinese Patent Application No. 202210449955.X, filed on Apr. 27, 2022. The disclosures of both of the aforementioned applications are hereby incorporated by reference in their entireties.

TECHNICAL FIELD

This application relates to the field of display technologies, and in particular, to a shift register, a gate drive circuit, a display panel, and an electronic device.

BACKGROUND

With continuous development of display technologies, an increasingly large quantity of electronic devices with a display function are widely applied to people's daily life and work, and bring great convenience to the people's daily life and work.

A main part used by the electronic device to implement the display function is a display panel. A drive circuit in the display panel outputs a drive signal to a pixel circuit in a pixel array based on a clock signal sent by a clock signal line, and controls the pixel array to display a picture.

With continuous improvement of display accuracy, there is a higher requirement on threshold compensation of the pixel circuit. A plurality of different drive signals are usually required in one pixel circuit. Each drive signal is generated by a respective drive circuit, and each drive circuit corresponds to a respective clock signal line. Therefore, a relatively large quantity of clock signal lines are required, and a relatively large quantity of clock control modules that provide clock signals for the clock signal lines are required in a display drive chip. However, a relatively large quantity of clock signal lines are not conducive to a narrow frame design of the display panel, and a relatively large quantity of clock control modules increase design costs of the display drive chip. In addition, the drive circuit usually includes a plurality of transistors, and stability deviation of the transistor usually causes a circuit logic error, and finally causes abnormal driving. Therefore, a circuit architecture with a simple structure and relatively high stability is required.

SUMMARY

To resolve the foregoing technical problem, this application provides a shift register, a gate drive circuit, a display panel, and an electronic device.

According to a first aspect, an embodiment of this application provides a shift register. The shift register includes: a node control module, electrically connected to a first level signal receive end, a second level signal receive end, a first clock signal end, a second clock signal end, a first node, and a second node; an input module, electrically connected to the second clock signal end, a trigger signal input end, and the second node; a voltage regulator module, electrically connected to the second node, the second clock signal end, and a third node; and an output module, electrically connected to the first level signal receive end, the second level signal receive end, the first node, the third node, and a drive signal output end. The input module is configured to: receive an input signal of the trigger signal input end, and control a signal of the second node in response to a second clock signal received by the second clock signal end. The node control module is configured to: receive a first level signal received by the first level signal receive end and a second level signal received by the second level signal receive end, and control a signal of the first node in response to the signal of the second node, a first clock signal received by the first clock signal end, and the second clock signal received by the second clock signal end. The output module is configured to: receive the second level signal received by the second level signal receive end, and control, in response to the signal of the first node, a signal output by the drive signal output end. Alternatively, the output module is configured to: receive the first level signal of the first level signal receive end, and control, in response to a signal of the third node, a signal output by the drive signal output end. The voltage regulator module is configured to: receive the signal of the second node, and control the signal of the third node in response to the second clock signal received by the second clock signal end. The first level signal is a low level signal, and the second level signal is a high level signal. When the signal output by the drive signal output end is a low level signal, a potential of the signal of the third node is less than a potential of the first level signal received by the first level signal receive end. The node control module includes at least one transistor whose active layer is an oxide semiconductor. At least one of the input module, the voltage regulator module, and the output module includes at least one transistor whose active layer is silicon.

The signal of the third node is controlled by using the voltage regulator module, so that when the signal output by the drive signal output end is at a low level, the potential of the signal of the third node is less than the potential of the low level received by the first level signal receive end, and further it is implemented that the signal output by the drive signal output end is at the low level received by the first level signal receive end. This avoids a case in which when the signal of the third node is at a relatively high level, the first level signal received by the output module from the first level signal receive end cannot be transmitted to the control drive signal output end, and consequently output of the signal is affected, to ensure a display effect of a display panel. In addition, the node control module includes the transistor of the oxide semiconductor, and therefore compared with all low temperature poly-silicon transistors, electric leakage of the first node can be reduced, so that the signal of the first node is stable, and the output signal is stable, to improve the display effect of the display panel. Furthermore, a combination of the transistor of the oxide semiconductor and the low temperature poly-silicon transistor is used in the shift register, and therefore the shift register can have features such as a relatively strong driving capability and low power consumption. In addition, it is proven that the shift register can effectively avoid a disadvantage of electric leakage of the low temperature poly-silicon transistor. Furthermore, when a threshold voltage offset of the low temperature poly-silicon transistor is relatively large (the threshold voltage offset is ∓2.5 V), the drive signal output end may still output a relatively stable waveform, to provide a specific tolerance error for a process. In addition, a gate drive circuit that uses the shift register has two functions, that is, can not only provide a light emission control signal for controlling a light emission control transistor on a light emission branch to be turned on or turned off, but also provide a scan control signal. That is, the gate drive circuit may be a light emission control drive circuit or a scan drive circuit. When both the light emission control drive circuit and the scan drive circuit are the gate drive circuit, the light emission control drive circuit and the scan drive circuit have a same structure. By changing an input signal of a first-stage circuit, two different types of drive signals (a light emission control signal or a scan signal) for a pixel circuit can be generated without changing a clock signal. In addition, because the light emission control drive circuit and the scan drive circuit have the same structure, a same clock signal is required. Therefore, a clock signal line may be multiplexed. In this way, a quantity of clock signal lines can be reduced, to facilitate a narrow frame design of the display panel, and a quantity of clock control modules that provide clock signals for the clock signal lines in a display drive chip can be reduced, to reduce design costs of the display drive chip.

In some possible implementations, the node control module includes: a first control unit, electrically connected to the first level signal receive end, the first clock signal end, the second clock signal end, the first node, and the second node; and a second control unit, electrically connected to the second level signal receive end, the first node, and the second node, where the first control unit is configured to: receive the first level signal of the first level signal receive end, and control the signal of the first node in response to the signal of the second node, the first clock signal received by the first clock signal end, and the second clock signal received by the second clock signal end; or the second control unit is configured to: receive the second level signal received by the second level signal receive end, and control the signal of the first node in response to the signal of the second node. That is, the first node is separately controlled by using an independent unit. When the first node needs the first level signal, the first level signal is transmitted to the first node by using the first control unit; and when the first node needs the second level signal, the second level signal is transmitted to the first node by using the second control unit. This avoids signal interference, so that the signal of the first node is more stable.

In some possible implementations, when the node control module includes the first control unit, the first control unit includes at least one transistor whose active layer is an oxide semiconductor, for example, a transistor whose active layer is IGZO. The IGZO transistor has an advantage of a small leakage current. Therefore, when a low level is provided for the first node by using the first control unit, stability of the signal of the first node can be ensured, and further it is ensured that the signal output by the drive signal output end is relatively stable. When the signal output by the drive signal output end is a light emission control signal, and when a low level is received, a light emission control transistor in the pixel circuit is conducted, and a display unit performs display, or when a high level is received, a light emission control transistor is cut off, and a display unit does not perform display, that is, when the light emission control signal output by the drive signal output end is at a high level, the light emission control transistor is cut off, and the display unit does not perform display, or when the signal output by the drive signal output end is at a low level, the light emission control transistor is conducted, and the display unit performs display. In addition, when the first control unit provides a low level for the first node, the light emission control signal output by the drive signal output end is a high level signal. Therefore, when the high level signal output by the drive signal output end is stable, it can be ensured that the light emission control transistor in the pixel circuit can be completely cut off, to avoid occurrence of a screen-on case.

In some possible implementations, the shift register further includes a protection module, located between the second node and the third node and between the second node and the voltage regulator module, and electrically connected to the first level signal receive end, where the protection module is configured to prevent the signal of the third node from being transmitted to the second node, to prevent the input module from being subject to a high Vds bias.

In some possible implementations, the input module includes a first transistor; and a gate of the first transistor is electrically connected to the second clock signal end, a first electrode of the first transistor is electrically connected to the trigger signal input end, and a second electrode of the first transistor is electrically connected to the second node. Certainly, a specific structure of the input module is not limited thereto. Persons skilled in the art may perform setting based on an actual situation, provided that normal input of the input signal is ensured. When the input module includes only one transistor, the structure is simple.

In some possible implementations, when the first control unit includes at least one transistor whose active layer is an oxide semiconductor, the first control unit includes a second transistor, a third transistor, and a fourth transistor; a gate of the second transistor is electrically connected to the first clock signal end, a first electrode of the second transistor is electrically connected to the first level signal receive end, and a second electrode of the second transistor, a gate of the fourth transistor, and a second electrode of the third transistor are coupled to a fourth node; a gate of the third transistor is electrically connected to the second node, and a first electrode of the third transistor is electrically connected to the second clock signal end; and a first electrode of the fourth transistor is electrically connected to the first level signal receive end, and a second electrode of the fourth transistor is electrically connected to the first node. Certainly, a specific structure of the input module is not limited thereto. Persons skilled in the art may perform setting based on an actual situation.

In some possible implementations, when the first control unit includes the second transistor, the third transistor, and the fourth transistor, the second transistor, the third transistor, and the fourth transistor are all transistors whose active layers are oxide semiconductors (which have an advantage of a small leakage current). When the first control unit provides a low level for the first node, stability of the signal of the first node may be further ensured, and further it is ensured that the light emission control signal output by the drive signal output end is relatively stable, to avoid occurrence of a screen-on case.

In some possible implementations, when the second control unit includes at least one transistor whose active layer is an oxide semiconductor, the second control unit includes a fifth transistor; and a gate of the fifth transistor is electrically connected to the second node, a first electrode of the fifth transistor is electrically connected to the second level signal receive end, and a second electrode of the fifth transistor is electrically connected to the first node. Certainly, a specific structure of the second control unit is not limited thereto. Persons skilled in the art may perform setting based on an actual situation. When the second control unit includes only one transistor, the structure is simple.

In some possible implementations, when the shift register includes the protection module, the protection module includes a sixth transistor; and a first electrode of the sixth transistor is electrically connected to the second node, a gate of the sixth transistor is electrically connected to the first level signal receive end, and a second electrode of the sixth transistor is separately electrically connected to the third node and the voltage regulator module. Certainly, a specific structure of the protection module is not limited thereto. Persons skilled in the art may perform setting based on an actual situation. When the protection module includes only one transistor, the structure is simple.

In some possible implementations, the voltage regulator module includes a seventh transistor and a first capacitor; and a gate of the seventh transistor is electrically connected to the third node, a first electrode of the seventh transistor is electrically connected to the first clock signal end, a second electrode of the seventh transistor is electrically connected to a second electrode of the first capacitor, and a first electrode of the first capacitor is separately electrically connected to the third node and the second electrode of the sixth transistor. The seventh transistor and the first capacitor form a capacitive coupling pull-down structure, so that when the signal output by the drive signal output end is at a low level, the potential of the signal of the third node is less than the potential of the low level received by the first level signal receive end, and further it is implemented that the signal output by the drive signal output end is at the low level received by the first level signal receive end.

In some possible implementations, the output module includes a second capacitor, an eighth transistor, and a ninth transistor; and both a gate of the eighth transistor and a first electrode of the second capacitor are electrically connected to the first node, both a first electrode of the eighth transistor and a second electrode of the second capacitor are electrically connected to the second level signal receive end, both a second electrode of the eighth transistor and a second electrode of the ninth transistor are electrically connected to the drive signal output end, a gate of the ninth transistor is electrically connected to the third node, and a first electrode of the ninth transistor is electrically connected to the first level signal receive end. Therefore, a structure is simple, and stability of the signal output by the drive signal output end is ensured.

In some possible implementations, the transistor whose active layer is an oxide semiconductor is an N-type transistor, and the transistor whose active layer is silicon is a P-type transistor. A quantity of thin film transistors required in the shift register is effectively reduced by using a combination of the N-type transistor and the P-type transistor, so that a structure of the shift register is simpler. When the shift register is applied to a display panel, a panel design with a narrower frame is facilitated.

According to a second aspect, an embodiment of this application further provides a gate drive circuit, including N mutually cascaded shift registers according to the first aspect, where N≥2.

The gate drive circuit has two functions, that is, can not only provide a light emission control signal for controlling a light emission control transistor on a light emission branch to be turned on or turned off, but also provide a scan control signal. That is, the gate drive circuit may be a light emission control drive circuit or a scan drive circuit. When both the light emission control drive circuit and the scan drive circuit are the gate drive circuit, the light emission control drive circuit and the scan drive circuit have a same structure. By changing an input signal of a first-stage circuit, two different types of drive signals (a light emission control signal or a scan signal) for a pixel circuit can be generated without changing a clock signal. In addition, because the light emission control drive circuit and the scan drive circuit have the same structure, a same clock signal is required. Therefore, a clock signal line may be multiplexed. In this way, a quantity of clock signal lines can be reduced, to facilitate a narrow frame design of the display panel, and a quantity of clock control modules that provide clock signals for the clock signal lines in a display drive chip can be reduced, to reduce design costs of the display drive chip.

According to a third aspect, an embodiment of this application further provides a display panel, including at least one gate drive circuit according to the second aspect, and having all effects of the gate drive circuit according to the second aspect.

In some possible implementations, at least two gate drive circuits are included, one gate drive circuit is a light emission control drive circuit, and the other gate drive circuit is a scan drive circuit; and a clock signal line electrically connected to the light emission control drive circuit is multiplexed as a clock signal line of the scan drive circuit.

According to a fourth aspect, an embodiment of this application further provides an electronic device, including the display panel according to the third aspect, and having all effects of the gate drive circuit according to the third aspect.

DESCRIPTION OF EMBODIMENTS

The following clearly and completely describes the technical solutions in the embodiments of this application with reference to the accompanying drawings in the embodiments of this application. Apparently, the described embodiments are some rather than all of the embodiments of this application. All other embodiments obtained by persons of ordinary skill in the art based on the embodiments of this application without creative efforts shall fall within the protection scope of this application.

In this specification, the term "and/or" is merely used to describe an association relationship between associated objects, and indicates that three relationships may exist. For example, A and/or B may indicate the following three cases: Only A exists, both A and B exist, and only B exists.

The terms "first", "second", and the like in this specification and claims of the embodiments of this application are used to distinguish between different objects, and are not used to describe a specific sequence of the objects. For example, a first target object and a second target object are used to distinguish between different target objects, but are not used to describe a specific sequence of the target objects.

In the embodiments of this application, words such as "an example" or "for example" are used to represent giving an example, an illustration, or a description. Any embodiment or design solution described as "an example" or "for example" in the embodiments of this application should not be construed as being more preferred or advantageous than other embodiments or design solutions. Exactly, use of the words such as "an example" or "for example" is intended to present a related concept in a specific manner.

In the descriptions of the embodiments of this application, unless otherwise stated, "a plurality of" means two or more. For example, "a plurality of processing units" means two or more processing units, and "a plurality of systems" means two or more systems.

Figure 1:
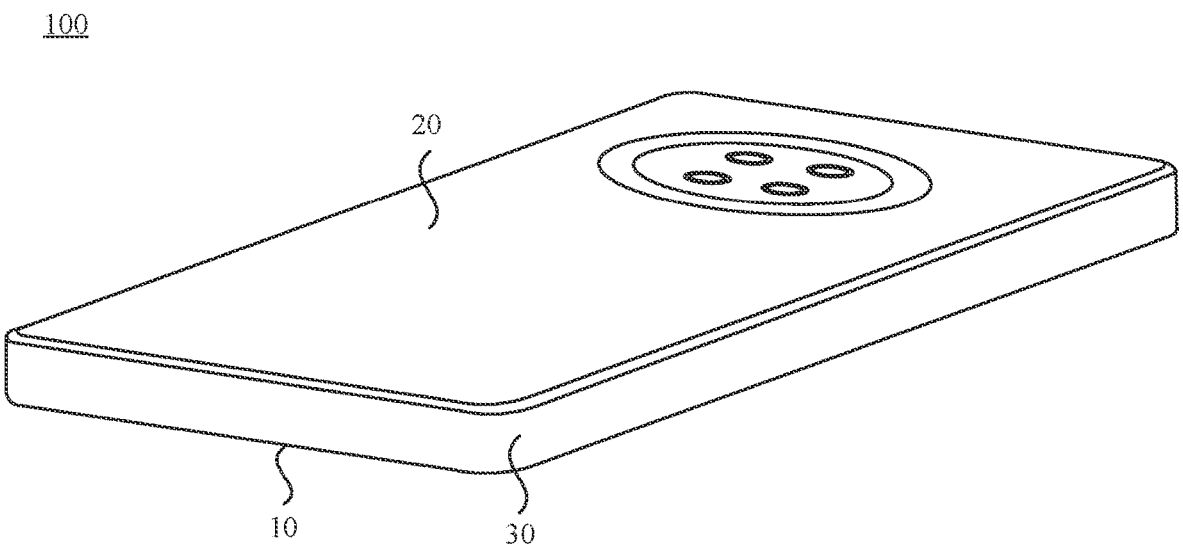
FIG. 1 is a schematic diagram of a structure of an electronic device according to an embodiment of this application.

An embodiment of this application provides an electronic device. The electronic device provided in this embodiment of this application may be an electronic device, for example, a mobile phone, a tablet, a laptop, a personal digital assistant (PDA), a vehicle-mounted computer, a smart wearable device, or a smart home device, that includes a display panel. A specific form of the electronic device is not specifically limited in this embodiment of this application. As shown in FIG. 1, for ease of description, an example in which the electronic device is a mobile phone is used below for description.

As shown in FIG. 1, the mobile phone 100 includes a display panel 10, a rear housing 20, and a middle frame 30. The display panel 10, the rear housing 20, and the middle frame 30 may enclose an accommodation chamber. Structures such as a mainboard, a battery, and a functional device (not shown in the figure) are disposed in the accommodation chamber. The functional device includes, for example, a display drive chip and a processor. The processor sends a corresponding signal to the display drive chip, so that the display drive chip drives the display panel 10 to display.

A material of the rear housing 20 may include, for example, an opaque material such as plastic, plain leather, or glass fiber, or may include a transparent material such as glass. The material of the rear housing 20 is not limited in this embodiment of this application.

The display panel 10 includes, for example, a liquid crystal display (LCD) panel, an organic light emitting diode (OLED) display panel, and an LED display panel. The LED display panel includes, for example, a Micro-LED display panel and a Mini-LED display panel. A type of the display panel 10 is not limited in this embodiment of this application. An example in which the display panel 10 is an OLED display panel is used below for description.

Figure 2:
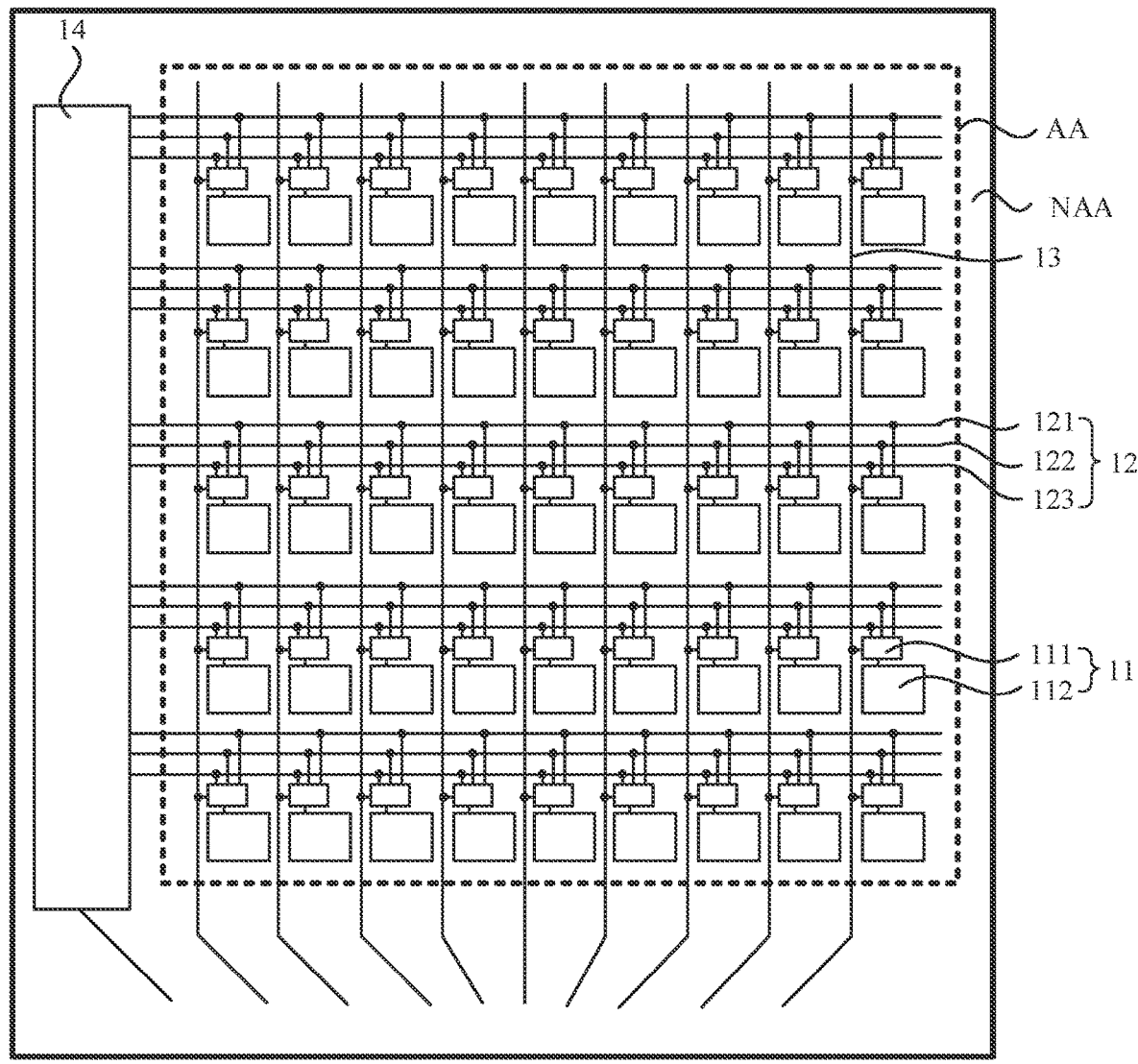
FIG. 2 is a schematic diagram of a structure of a display panel according to an embodiment of this application.

As shown in FIG. 2, the display panel 10 includes a display area AA and a non-display area NAA. The non-display area NAA is disposed, for example, around the display area AA. A plurality of pixels 11 arranged in an array, a plurality of scan line groups 12, and a plurality of data lines 13 are disposed in the display area AA of the display panel 10. Each pixel 11 includes a pixel circuit 111 and a display unit 112. The plurality of data lines 13 are in a one-to-one correspondence with pixel circuits 111 in a plurality of columns of pixels 11, that is, a pixel circuit 111 in one column of pixels 11 corresponds to one data line 13. The plurality of scan line groups 12 are in a one-to-one correspondence with pixel circuits 111 in a plurality of rows of pixels 11, that is, a pixel circuit 111 in one row of pixels 11 corresponds to one scan line group 12.

Figure 3:
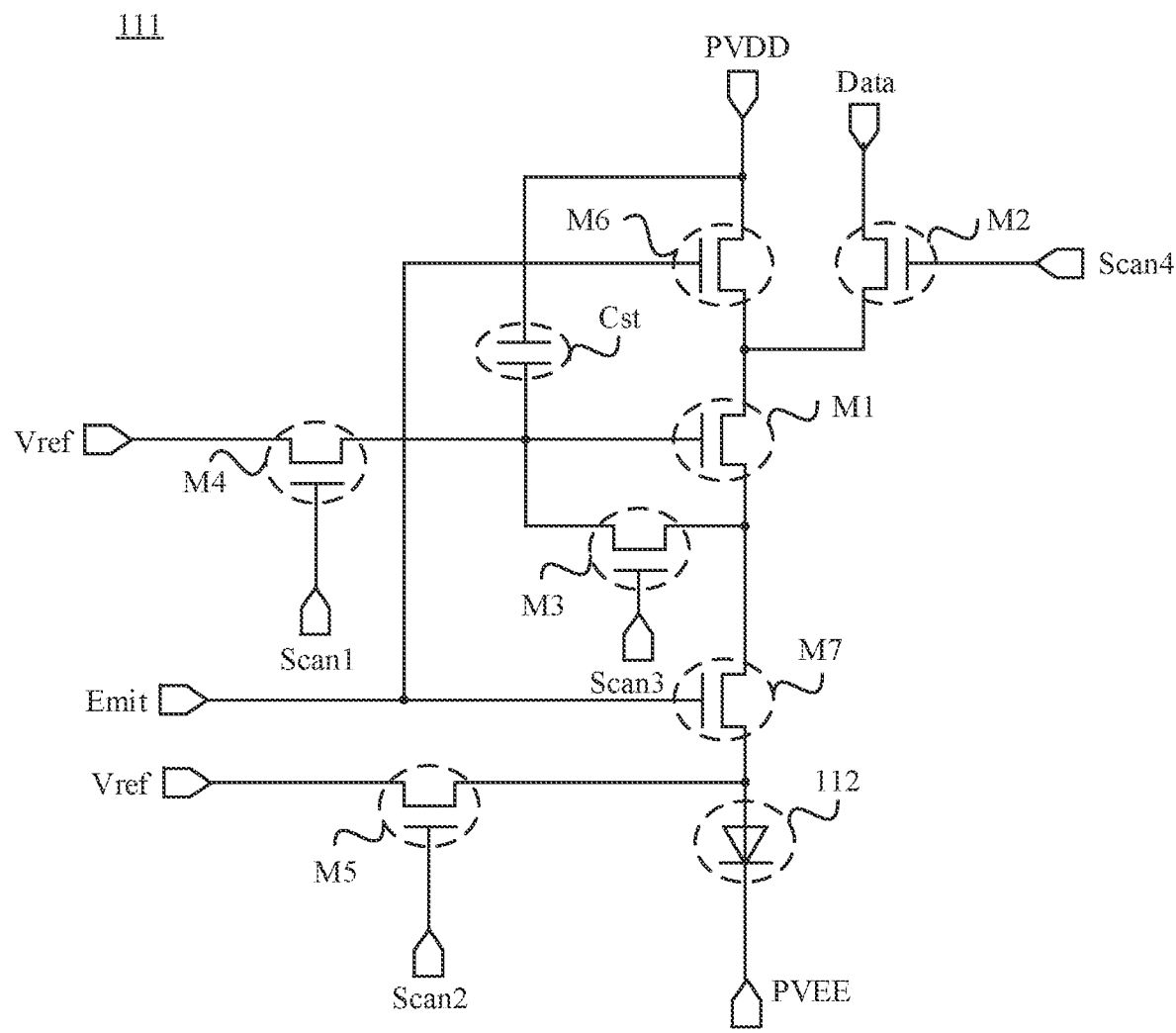
FIG. 3 is a schematic diagram of a structure of a pixel circuit according to an embodiment of this application.

With reference to FIG. 3, the pixel circuit 111 includes, for example, seven transistors and one capacitor (seven transistors and one storage capacitor), that is, the pixel circuit 111 may include a drive transistor M1, a data write transistor M2, a threshold compensation transistor M3, reset transistors M4 and M5, light emission control transistors M6 and M7, and a storage capacitor Cst.

It may be understood that a specific structure of the pixel circuit 111 includes but is not limited to the foregoing example. In another optional embodiment, the pixel circuit 111 may be disposed in another manner provided that the display unit 112 can be driven to emit light.

The reset transistor M4 and the threshold compensation transistor M3 are transistors that use an oxide semiconductor material such as indium gallium zinc oxide (IGZO) as an active layer, and the drive transistor M1, the data write transistor M2, the reset transistor M5, and the light emission control transistors M6 and M7 are transistors that use silicon, which is optionally poly-silicon, for example, a low temperature poly-silicon (LTPS) material, as an active layer. That is, the LTPS transistor and the IGZO transistor are integrated on a substrate, to form a low temperature polycrystalline oxide (LTPO) display panel 10.

The low temperature poly-silicon transistor has advantages such as high carrier mobility, a fast response, and low power consumption, and the oxide semiconductor transistor has an advantage of a small leakage current. Therefore, when the pixel circuit 111 includes both a transistor that uses the LTPS material as an active layer and a transistor that uses the IGZO material as an active layer, it can be ensured that the pixel circuit 111 has relatively good performance.

In addition, the pixel circuit 111 further includes an initialization signal end Vref, a first power supply end PVDD, a second power supply end PVEE, a data signal end Data, a first scan signal end Scan1, a second scan signal end Scan2, a third scan signal end Scan3, a fourth scan signal end Scan4, and a light emission control signal end Emit. A first electrode of the light emission control transistor M6 is electrically connected to the first power supply end PVDD. A first electrode of the data write transistor M2 is electrically connected to the data signal end Data, and a gate of the data write transistor M2 is electrically connected to the fourth scan signal end Scan4. A gate of the threshold compensation transistor M3 is electrically connected to the third scan signal end Scan3. First electrodes of the reset transistors M4 and M5 are separately electrically connected to the initialization signal end Vref (the reset transistors M4 and M5 may correspond to a same initialization signal end or different initialization signal ends). A gate of the reset transistor M4 may be electrically connected to the first scan signal end Scan1. A gate of the reset transistor M5 may be electrically connected to the second scan signal end Scan2. Gates of the light emission control transistors M6 and M7 may be separately electrically connected to the light emission control signal end Emit. The light emission control transistor M7 is electrically connected to an anode of the first light emitting element 112, and a cathode of the first light emitting element 112 is electrically connected to the second power supply end PVEE.

Correspondingly, still referring to FIG. 2, each scan line group 12 includes a first scan signal line 121, a second scan signal line 122, and a light emission control signal line 123.

Correspondingly, that a pixel circuit 111 in one column of pixels 11 corresponds to one data line 13 means that data signal ends Data in pixel circuits 111 in pixels 11 in a same column are electrically connected to a same data line 13. That a pixel circuit 111 in one row of pixels 11 corresponds to one scan line group 12 means that first scan signal ends Scan1 in pixel circuits 111 in pixels 11 in a same row are electrically connected to a first scan signal line 121 corresponding to the row, second scan signal ends Scan2 in the pixel circuits 111 in the pixels 11 in the same row are electrically connected to a second scan signal line 122 corresponding to the row, third scan signal ends Scan3 in the pixel circuits 111 in the pixels 11 in the same row are electrically connected to a first scan signal line 121 corresponding to another row (a specific row may be set by persons skilled in the art based on an actual situation), fourth scan signal ends Scan4 in the pixel circuits 111 in the pixels 11 in the same row are electrically connected to a second scan signal line 122 corresponding to another row (a specific row may be set by persons skilled in the art based on an actual situation), and light emission control signal ends Emit in the pixel circuits 111 in the pixels 11 in the same row are electrically connected to a same light emission control signal line 123.

It should be noted that to ensure brevity and clarity of the circuit, FIG. 2 does not show a case in which the third scan signal ends Scan3 in the pixel circuits 111 in the pixels 11 in the same row are electrically connected to the first scan signal line 121 corresponding to the another row, and the fourth scan signal ends Scan4 in the pixel circuits 111 in the pixels 11 in the same row are electrically connected to the second scan signal line 122 corresponding to the another row.

That is, three types of gate control signals are usually required in the pixel circuit 111 that uses an LTPO technology. A first signal is a light emission control signal transmitted by the light emission control signal line 123, that is, the light emission control signal transmitted by the light emission control signal line 123 may control the light emission control transistors M6 and M7 on a light emission branch to be turned on or turned off. A second signal is a first scan signal transmitted by the first scan signal line 121, that is, the first scan signal transmitted by the first scan signal line 121 may control the reset transistor M4 and the threshold compensation transistor M3 whose active layers are IGZO to be turned on or turned off, that is, a first scan signal transmitted by a first scan signal line 121 corresponding to a row in which the reset transistor M4 is located may control the reset transistor M4 to be turned on or turned off, and a first scan signal transmitted by a first scan signal line 121 corresponding to another row may control the threshold compensation transistor M3 to be turned on or turned off. A third signal is a second scan signal transmitted by the second scan signal line 122, that is, the second scan signal transmitted by the second scan signal line 122 may control the reset transistor M5 and the data write transistor M2 whose active layers are LTPS to be turned on or turned off, that is, a second scan signal transmitted by a second scan signal line 122 corresponding to a row in which the reset transistor M5 is located may control the reset transistor M5 to be turned on or turned off, and a second scan signal transmitted by a second scan signal line 122 corresponding to another row may control the data write transistor M2 to be turned on or turned off.

A principle of driving, by the pixel circuit 111 based on the light emission control signal, the first scan signal, the second scan signal, and the like, the display unit 112 to emit light is similar to a principle of driving, by a pixel circuit that includes seven transistors and one capacitor in the conventional technology, the display unit to emit light. Details are not described herein.

Still referring to FIG. 2, a drive circuit 14 is disposed in the non-display area NAA of the display panel 10. The drive circuit 14 may include, for example, a first scan drive circuit, a second scan drive circuit, and a light emission control drive circuit. The first scan drive circuit includes a plurality of first scan signal output ends, the second scan drive circuit includes a plurality of second scan signal output ends, and the light emission control drive circuit includes a plurality of light emission control signal output ends. The plurality of first scan signal output ends of the first scan drive circuit are electrically connected to a plurality of first scan signal lines 121 in the display area AA in a one-to-one correspondence, the plurality of second scan signal output ends of the second scan drive circuit are electrically connected to a plurality of second scan signal lines 122 in the display area AA in a one-to-one correspondence, and the plurality of light emission control signal output ends of the light emission control drive circuit are electrically connected to light emission control signal lines 123 in the display area AA in a one-to-one correspondence. The first scan drive circuit transmits the first scan signal to the first scan signal line 121 by using the first scan signal output end, the second scan drive circuit transmits the second scan signal to the second scan signal line 122 by using the second scan signal output end, and the light emission control drive circuit transmits the light emission control signal to the light emission control signal line 123 by using the light emission control signal output end.

To resolve the problem in the background, an embodiment of this application provides a gate drive circuit. The gate drive circuit has two functions, that is, can not only provide a light emission control signal for controlling the light emission control transistors M6 and M7 on the light emission branch to be turned on or turned off, but also provide a first scan signal for controlling the reset transistor M4 and the threshold compensation transistor M3 to be turned on or turned off. That is, the gate drive circuit may be a light emission control drive circuit or a first scan drive circuit. When both the light emission control drive circuit and the first scan drive circuit are the gate drive circuit, the light emission control drive circuit and the first scan drive circuit have a same structure. By changing an input signal of a first-stage circuit, two different types of drive signals (a light emission control signal or a first scan signal) for a pixel circuit can be generated without changing a clock signal. In addition, because the light emission control drive circuit and the first scan drive circuit have the same structure, a same clock signal is required. Therefore, a clock signal line may be multiplexed. In this way, a quantity of clock signal lines can be reduced, to facilitate a narrow frame design of a display panel, and a quantity of clock control modules that provide clock signals for the clock signal lines in a display drive chip can be reduced, to reduce design costs of the display drive chip.

The following describes a specific structure of the gate drive circuit provided in this embodiment of this application.

Figure 4:
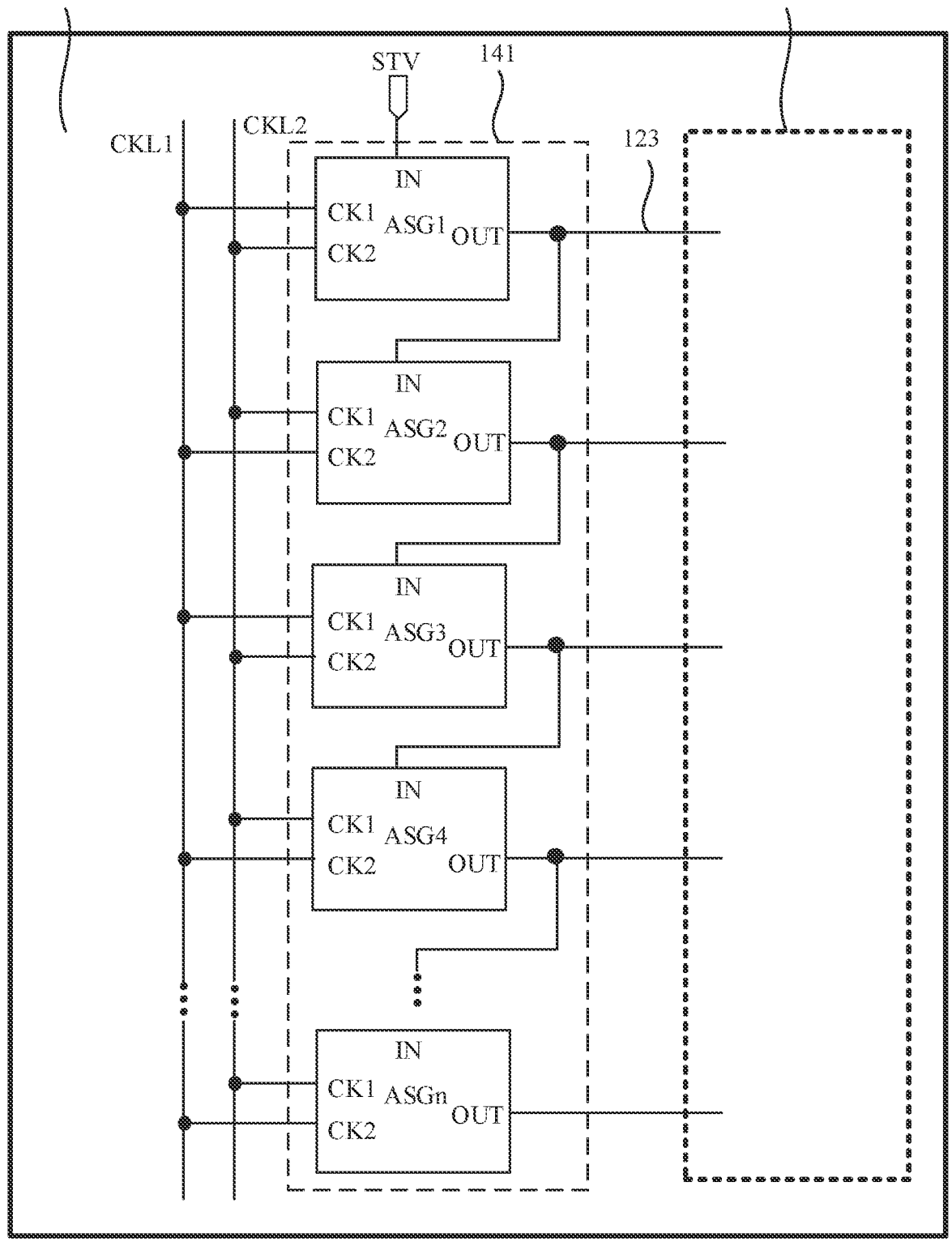
FIG. 4 is a schematic diagram of a structure of another display panel according to an embodiment of this application.

As shown in FIG. 4, in this embodiment of this application, the gate drive circuit 141 includes N cascaded shift registers ASG, for example, may include N shift registers ASG1~ASGn, where N≥2. A specific value of N may be set by persons skilled in the art based on an actual situation. This is not limited herein.

Each stage of shift register ASG includes a first clock signal end CK1, a second clock signal end CK2, a trigger signal input end IN, and a drive signal output end OUT. Except for a last stage of shift register ASGn, a drive signal output end OUT of each stage of shift register ASG is electrically connected to a trigger signal input end IN of a next stage of shift register ASG adjacent to the stage of shift register ASG, and a trigger signal input end IN of a first stage of shift register ASG1 receives a trigger signal STV sent by a trigger signal line (not shown in FIG. 4). The shift register ASG sends a light emission control signal to the light emission control signal line 123 or a first scan signal to the first scan signal line 121 by using the drive signal output end OUT based on a first clock signal input from the first clock signal end CK1, a second clock signal input from the second clock signal end CK2, and a trigger signal STV input from the trigger signal input end IN.

The display panel 10 further includes a first clock signal line CKL1 and a second clock signal line CKL2 located in the non-display area NAA. A first clock signal end CK1 of an odd-numbered stage of shift register ASG is electrically connected to the first clock signal line CKL1, and a second clock signal end CK2 of the odd-numbered stage of shift register ASG is electrically connected to the second clock signal line CKL2. A first clock signal end CK1 of an even-numbered stage of shift register ASG is electrically connected to the second clock signal line CKL2, and a second clock signal end CK2 of the even-numbered stage of shift register ASG is electrically connected to the first clock signal line CKL1. As shown in FIG. 4, first clock signal ends CK1 of the first stage of shift register ASG1 and a third stage of shift register ASG3 are electrically connected to the first clock signal line CKL1, second clock signal ends CK2 of the first stage of shift register ASG1 and the third stage of shift register ASG3 are electrically connected to the second clock signal line CKL2, first clock signal ends CK1 of a second stage of shift register ASG2 and a fourth stage of shift register ASG4 are electrically connected to the second clock signal line CKL2, and second clock signal ends CK2 of the second stage of shift register ASG2 and the fourth stage of shift register ASG4 are electrically connected to the first clock signal line CKL1.

Figure 5:
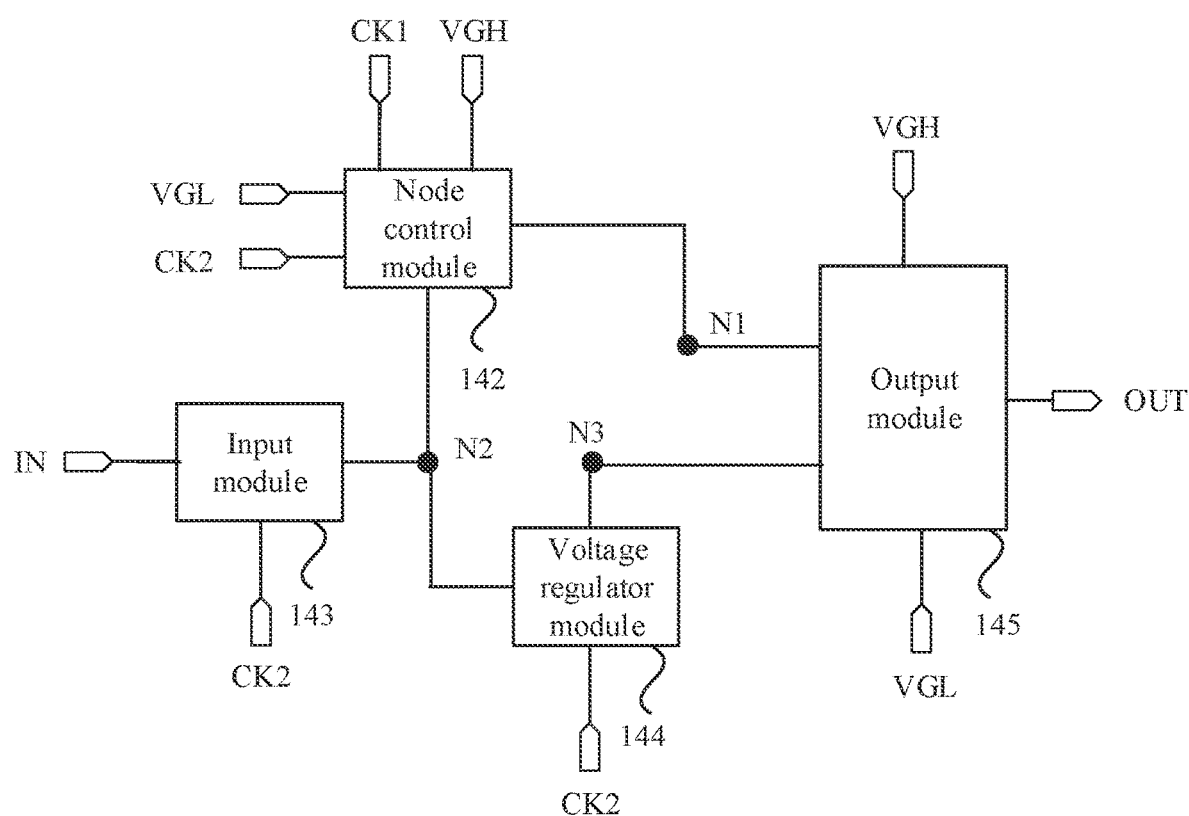
FIG. 5 is a schematic diagram of a structure of a shift register according to an embodiment of this application.

With reference to FIG. 5, each stage of shift register ASG further includes a first level signal receive end VGL, a second level signal receive end VGH, a node control module 142, an input module 143, a voltage regulator module 144, and an output module 145.

The node control module 142 is electrically connected to the first level signal receive end VGL, the second level signal receive end VGH, the first clock signal end CK1, the second clock signal end CK2, a first node N1, and a second node N2. The input module 143 is electrically connected to the second clock signal end CK2, the trigger signal input end IN, and the second node N2. The voltage regulator module 144 is electrically connected to the second node N2, the second clock signal end CK2, and a third node N3. The output module 145 is electrically connected to the first level signal receive end VGL, the second level signal receive end VGH, the first node N1, the third node N3, and the drive signal output end OUT.

The input module 143 is configured to: receive the input signal STV of the trigger signal input end IN, and control a signal of the second node N2 in response to the second clock signal CKV2 received by the second clock signal end CK2.

The node control module 142 is configured to: receive a first level signal of the first level signal receive end VGL and a second level signal of the second level signal receive end VGH, and control a signal of the first node N1 in response to the signal of the second node N2, the first clock signal CKV1 received by the first clock signal end CK1, and the second clock signal CKV2 received by the second clock signal end CK2.

The output module 145 is configured to: receive the second level signal received by the second level signal receive end VGH, and control, in response to the signal of the first node N1, the drive signal output end OUT to output a light emission control signal or a first scan signal. Alternatively, the output module 145 is configured to: receive the first level signal of the first level signal receive end VGL, and control, in response to a signal of the third node N3, the drive signal output end OUT to output a light emission control signal or a first scan signal.

The voltage regulator module 144 is configured to: receive the signal of the second node N2, and control the signal of the third node N3 in response to the second clock signal CKV2 received by the second clock signal end CK2. The first level signal is a low level signal, and the second level signal is a high level signal. When the signal output by the drive signal output end OUT is a low level signal, a potential of the signal of the third node N3 is less than a potential of the first level signal received by the first level signal receive end VGL.

In addition, the node control module 142 includes at least one transistor. The transistor is a transistor that uses an oxide semiconductor material, for example, IGZO, as an active layer. At least one of the input module 143, the voltage regulator module 144, and the output module 145 includes at least one transistor. The transistor is a transistor that uses silicon that is optionally poly-silicon, for example, LTPS, as an active layer.

In this embodiment of this application, the input module 143 receives the input signal STV, and controls the signal of the second node N2 in response to the second clock signal CKV2; the node control module 142 receives the first level signal and the second level signal, and controls the signal of the first node N1 in response to the signal of the second node N2, the first clock signal CKV1, and the second clock signal CKV2; and the output module 145 receives the second level signal, and controls the output signal in response to the signal of the first node N1; or the output module 145 receives the first level signal, and controls the output signal in response to the signal of the third node N3. The potential of the third node N3 affects the output signal. Therefore, the signal of the third node N3 is controlled by using the voltage regulator module 144, so that when the signal output by the drive signal output end OUT is at a low level, the potential of the signal of the third node N3 is less than the potential of the low level received by the first level signal receive end VGL, and further it is implemented that the signal output by the drive signal output end OUT is at the low level received by the first level signal receive end VGL. This avoids a case in which when the output module 145 includes a transistor, due to a threshold loss of the transistor, the first level signal received by the output module 145 from the first level signal receive end VGL cannot be transmitted to the control drive signal output end OUT, and consequently output of the signal is affected. In addition, the node control module 142 includes the IGZO transistor, and therefore compared with all LTPS transistors, electric leakage of the first node N1 can be reduced, so that the signal of the first node N1 is stable, and the output signal is stable. Furthermore, a combination of the IGZO transistor and the LTPS transistor is used in the shift register ASG, and therefore the shift register ASG can have features such as a relatively strong driving capability and low power consumption.

Optionally, the IGZO transistor included in the node control module 142 is an N-type IGZO transistor, and the LTPS transistor included in the at least one of the input module 143, the voltage regulator module 144, and the output module 145 is a P-type LTPS transistor. A quantity of thin film transistors required in the shift register ASG is effectively reduced by using a combination of the N-type transistor and the P-type transistor, so that a structure of the shift register ASG is simpler, to facilitate a panel design with a narrower frame.

Figure 6:
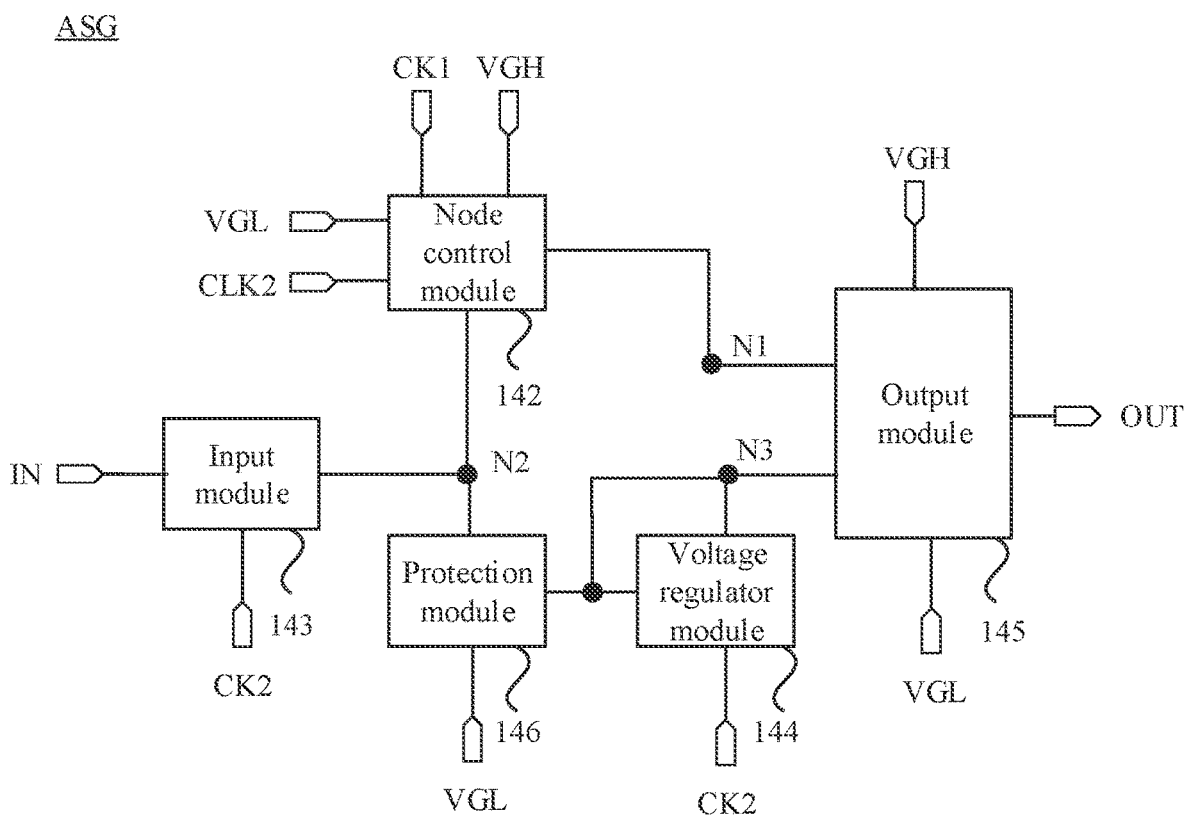
FIG. 6 is a schematic diagram of a structure of another shift register according to an embodiment of this application.

In some possible embodiments, referring to FIG. 6, each stage of shift register ASG further includes a protection module 146, located between the second node N2 and the third node N3 and between the second node N2 and the voltage regulator module 144, and electrically connected to the first level signal receive end VGL. The protection module 146 is configured to prevent the signal of the third node N3 from being transmitted to the second node N2, that is, perform a pinch-off function, to prevent the input module 143 from being subject to a high Vds bias.

Figure 7:
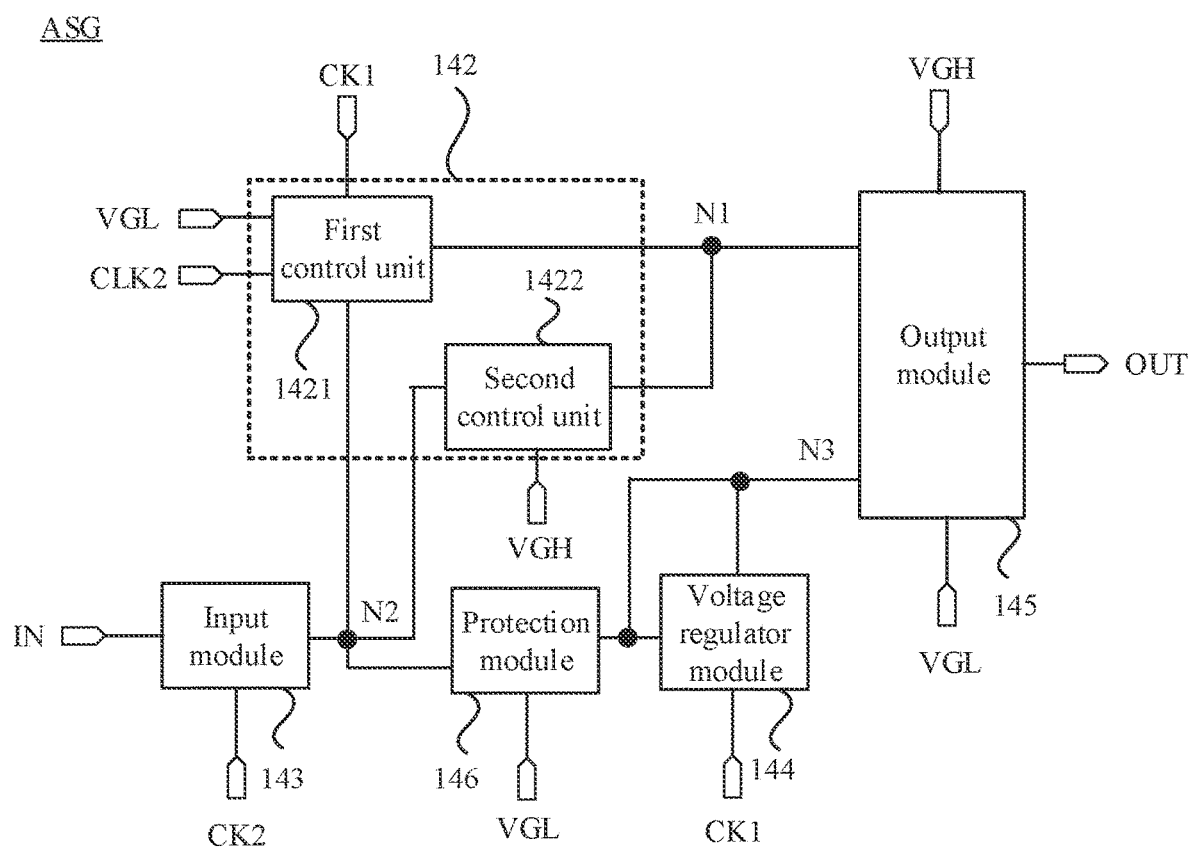
FIG. 7 is a schematic diagram of a structure of another shift register according to an embodiment of this application.

In some possible embodiments, referring to FIG. 7, the node control module 142 includes a first control unit 1421 and a second control unit 1422. The first control unit 1421 is electrically connected to the first level signal receive end VGL, the first clock signal end CK1, the second clock signal end CK2, the first node N1, and the second node N2. The second control unit 1422 is electrically connected to the second level signal receive end VGH, the first node N1, and the second node N2.

The first control unit 1421 is configured to: receive the first level signal of the first level signal receive end VGL, and control the signal of the first node N1 in response to the signal of the second node N2, the first clock signal CKV1 received by the first clock signal end CK1, and the second clock signal CKV2 received by the second clock signal end CK2. Alternatively, the second control unit 1422 is configured to: receive the second level signal received by the second level signal receive end VGH, and control the signal of the first node N1 in response to the signal of the second node N2. In other words, the first level signal may be provided for the first node N1 by using the first control unit 1421, and the second level signal may be provided for the first node N1 by using the second control unit 1422. In other words, when the first node N1 needs the first level signal, the first level signal is transmitted to the first node N1 by using the first control unit 1421; and when the first node N1 needs the second level signal, the second level signal is transmitted to the first node N1 by using the second control unit 1422. In addition, when the first node N1 needs the first level signal, the output module 145 outputs, through the drive signal output end OUT, the second level signal received by the second level signal receive end VGH; and when the first node N1 needs the second level signal, the output module 145 cannot output, through the drive signal output end OUT, the second level signal received by the second level signal receive end VGH.

In addition, the first control unit 1421 includes at least one transistor. The transistor is a transistor that uses an oxide semiconductor material, for example, IGZO, as an active layer. The IGZO transistor has an advantage of a small leakage current. Therefore, when a low level is provided for the first node N1 by using the first control unit 1421, stability of the signal of the first node N1 can be ensured, and further it is ensured that the signal output by the drive signal output end OUT is relatively stable. When the signal output by the drive signal output end OUT is a light emission control signal (that is, the gate drive circuit is a light emission control drive circuit), and when a low level is received, the light emission control transistors M6 and M7 in the pixel circuit 111 are conducted, and the display unit 112 performs display, or when a high level is received, the light emission control transistors M6 and M7 are cut off, and the display unit 112 does not perform display, that is, when the light emission control signal output by the drive signal output end OUT is at a high level, the light emission control transistors M6 and M7 are cut off, and the display unit 112 does not perform display, or when the signal output by the drive signal output end OUT is at a low level, the light emission control transistors M6 and M7 are conducted, and the display unit 112 performs display. In addition, when the first control unit 1421 provides a low level for the first node N1, the light emission control signal output by the drive signal output end OUT is a high level signal. Therefore, when the high level signal output by the drive signal output end OUT is stable, it can be ensured that the light emission control transistors M6 and M7 in the pixel circuit 111 can be completely cut off, to avoid occurrence of a screen-on case.

Figure 8:
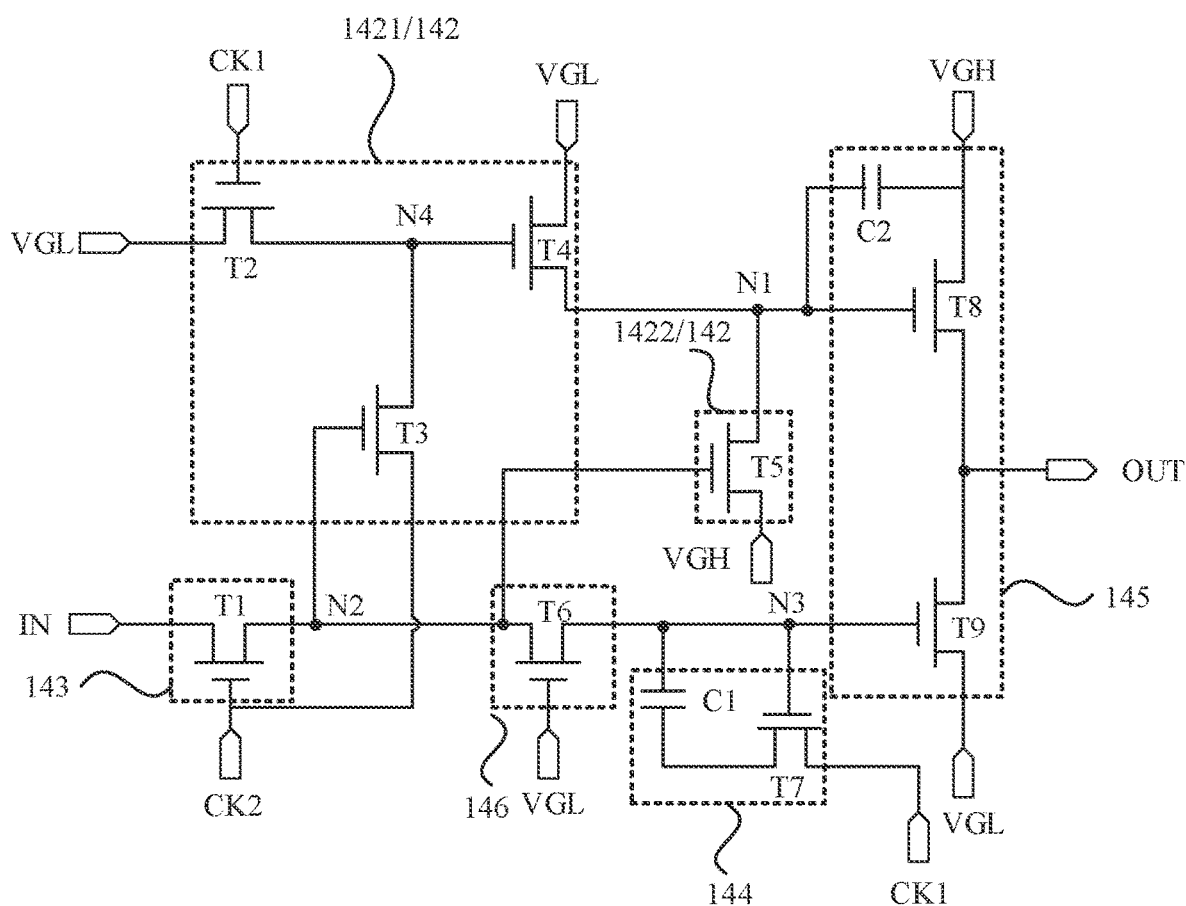
FIG. 8 is a schematic diagram of a structure of another shift register according to an embodiment of this application.

In some possible embodiments, referring to FIG. 8, the input module 143 includes a first transistor T1. A gate of the first transistor T1 is electrically connected to the second clock signal end CK2, a first electrode of the first transistor T1 is electrically connected to the trigger signal input end IN, and a second electrode of the first transistor T1 is electrically connected to the second node N2. For example, the first transistor T1 is a transistor that uses silicon that is optionally poly-silicon, for example, LTPS, as an active layer.

It should be noted that the first electrode of the first transistor T1 may be a source electrode of the first transistor T1, and the second electrode of the first transistor T1 may be a drain electrode of the first transistor T1. Alternatively, the first electrode of the first transistor T1 may be a drain electrode of the first transistor T1, and the second electrode of the first transistor T1 may be a source electrode of the first transistor T1. Transistors in the following embodiments are the same as this. Details are not described in the following embodiments.

In some possible embodiments, referring to FIG. 8, the first control unit 1421 includes a second transistor T2, a third transistor T3, and a fourth transistor T4. A gate of the second transistor T2 is electrically connected to the first clock signal end CK1, a first electrode of the second transistor T2 is electrically connected to the first level signal receive end VGL, and a second electrode of the second transistor T2, a gate of the fourth transistor T4, and a second electrode of the third transistor T3 are coupled to a fourth node N4. A gate of the third transistor T3 is electrically connected to the second node N2, and a first electrode of the third transistor T3 is electrically connected to the second clock signal end CK2. A first electrode of the fourth transistor T4 is electrically connected to the first level signal receive end VGL, and a second electrode of the fourth transistor T4 is electrically connected to the first node N1. The second transistor T2, the third transistor T3, and the fourth transistor T4 are all, for example, transistors that use an oxide semiconductor material, for example, IGZO, as an active layer.

In some possible embodiments, referring to FIG. 8, the second control unit 1422 includes a fifth transistor T5. A gate of the fifth transistor T5 is electrically connected to the second node N2, a first electrode of the fifth transistor T5 is electrically connected to the second level signal receive end VGH, and a second electrode of the fifth transistor T5 is electrically connected to the first node N1.

In some possible embodiments, referring to FIG. 8, the protection module 146 includes a sixth transistor T6. A first electrode of the sixth transistor T6 is electrically connected to the second node N2, a gate of the sixth transistor T6 is electrically connected to the first level signal receive end VGL, and a second electrode of the sixth transistor T6 is separately electrically connected to the third node N3 and the voltage regulator module 144. For example, the sixth transistor T6 is a transistor that uses silicon that is optionally poly-silicon, for example, LTPS, as an active layer.

In some possible embodiments, referring to FIG. 8, the voltage regulator module 144 includes a seventh transistor T7 and a first capacitor C1. A gate of the seventh transistor T7 is electrically connected to the third node N3, a first electrode of the seventh transistor T7 is electrically connected to the first clock signal end CK1, a second electrode of the seventh transistor T7 is electrically connected to a second electrode of the first capacitor C1, and a first electrode of the first capacitor C1 is separately electrically connected to the third node N3 and the second electrode of the sixth transistor T6. For example, the seventh transistor T7 is a transistor that uses silicon that is optionally poly-silicon, for example, LTPS, as an active layer.

In some possible embodiments, referring to FIG. 8, the output module 145 includes a second capacitor C2, an eighth transistor T8, and a ninth transistor T9. Both a gate of the eighth transistor T8 and a first electrode of the second capacitor C2 are electrically connected to the first node N1, both a first electrode of the eighth transistor T8 and a second electrode of the second capacitor C2 are electrically connected to the second level signal receive end VGH, both a second electrode of the eighth transistor T8 and a second electrode of the ninth transistor T9 are electrically connected to the drive signal output end OUT, a gate of the ninth transistor T9 is electrically connected to the third node N3, and a first electrode of the ninth transistor T9 is electrically connected to the first level signal receive end VGL. For example, both the eighth transistor T8 and the ninth transistor T9 are transistors that use silicon that is optionally poly-silicon, for example, LTPS, as an active layer.

The structure of the gate drive circuit is specifically described above. A working process existing when the gate drive circuit is a light emission control drive circuit and a working process existing when the gate drive circuit is a first scan drive circuit are separately described below.

The working process existing when the gate drive circuit is a light emission control drive circuit is first described.

Figure 9:
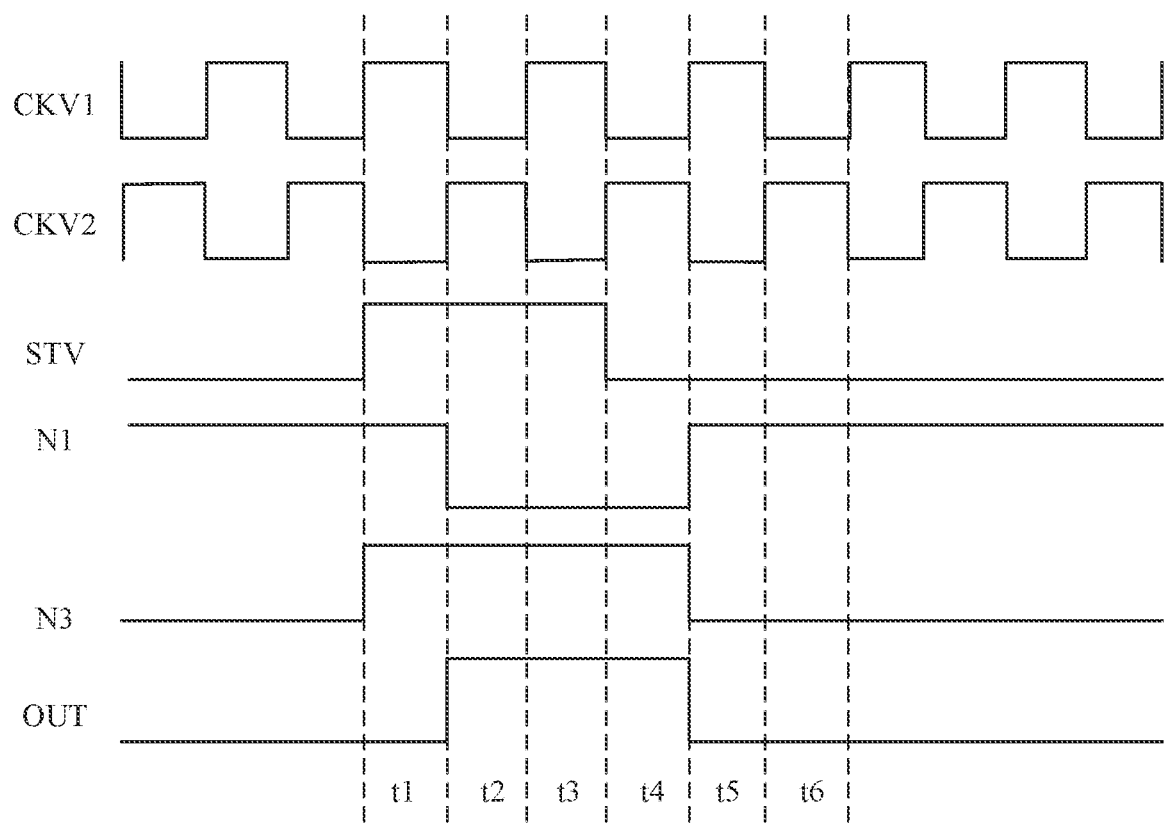
FIG. 9 is a schematic diagram of a time sequence in a shift register according to an embodiment of this application.

FIG. 9 is a diagram of a time sequence of signals in the shift register existing when the gate drive circuit is a light emission control drive circuit. A working process of the shift register shown in FIG. 8 is described below with reference to the diagram of the time sequence of the signals in the shift register existing when the gate drive circuit is a light emission control drive circuit. A time sequence of signals in a shift register of another structure is basically the same as this. Details are not described herein. For example, the second transistor T2, the third transistor T3, and the fourth transistor T4 are N-type IGZO transistors, the first transistor T1, the fifth transistor T5, the sixth transistor T6, the seventh transistor T7, the eighth transistor T8, and the ninth transistor T9 are P-type LTPS transistors, the first level signal received by the first level signal receive end VGL is −7 V, and the second level signal received by the second level signal receive end VGH is 7 V.

Figure 10:
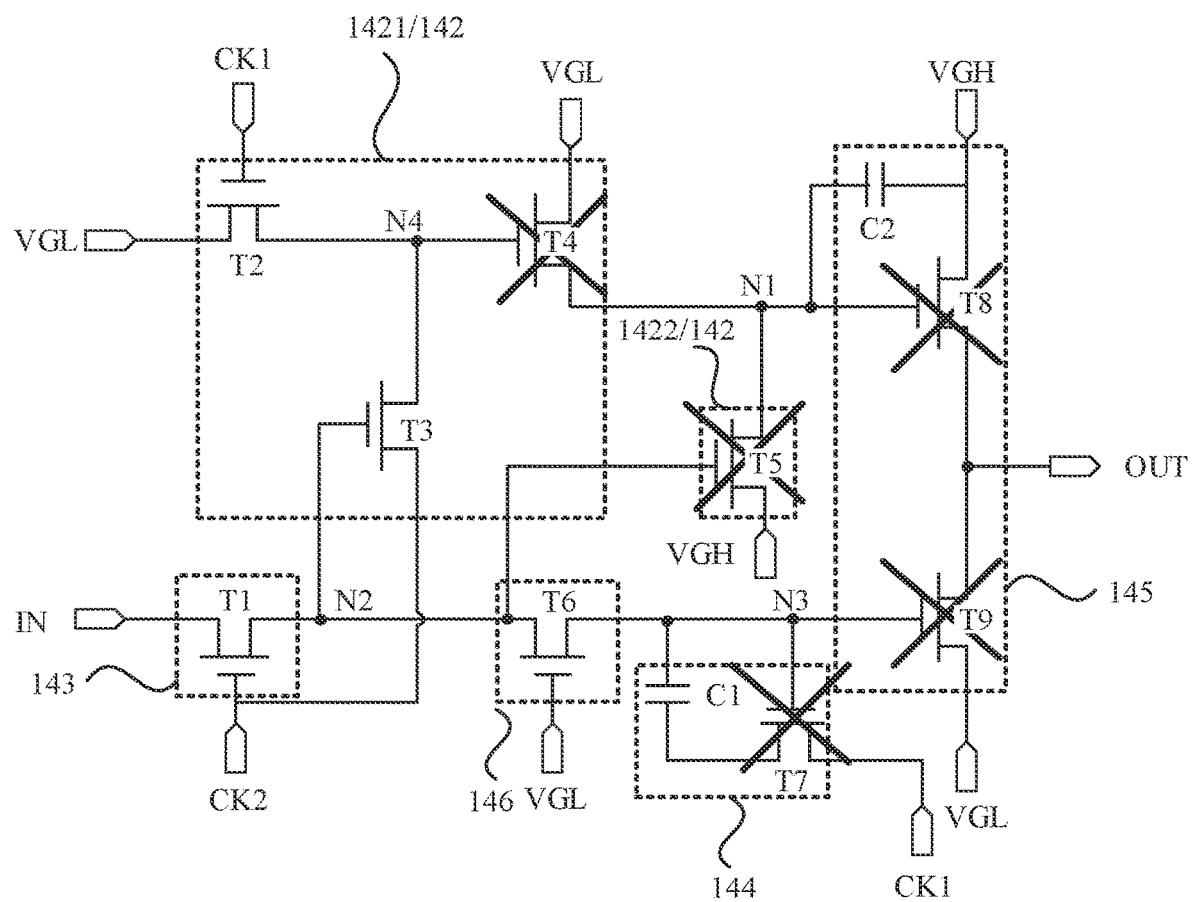
FIG. 10 is a diagram of a working process of a shift register according to an embodiment of this application.

In a first phase t1, namely, a phase of inputting a high level of STV, with reference to FIG. 10, CKV1 received by the first clock signal end CK1 changes from a low level to a high level, CKV2 received by the second clock signal end CK2 changes from a high level to a low level, the first transistor T1 is turned on, the sixth transistor T6 is turned on, the high level of the input signal STV received by the trigger signal input end IN is written to the third node N3, the third node N3 is pulled high, and the ninth transistor T9 is turned off. In addition, the fifth transistor T5 is turned off, the third transistor T3 is turned on, and the first node N1 cannot be set high by using the fifth transistor T5. Furthermore, at the high level of CKV1, the second transistor T2 is turned on, and the third transistor T3 transmits the low level of CKV2 to the fourth node N4. In this case, the fourth node N4 is in a low level state, the fourth transistor T4 is turned off, and the first node N1 still remains at a high level. Because of a holding function of the second capacitor C2, the light emission control signal output by the drive signal output end OUT is still at a low level in this case.

Figure 11:
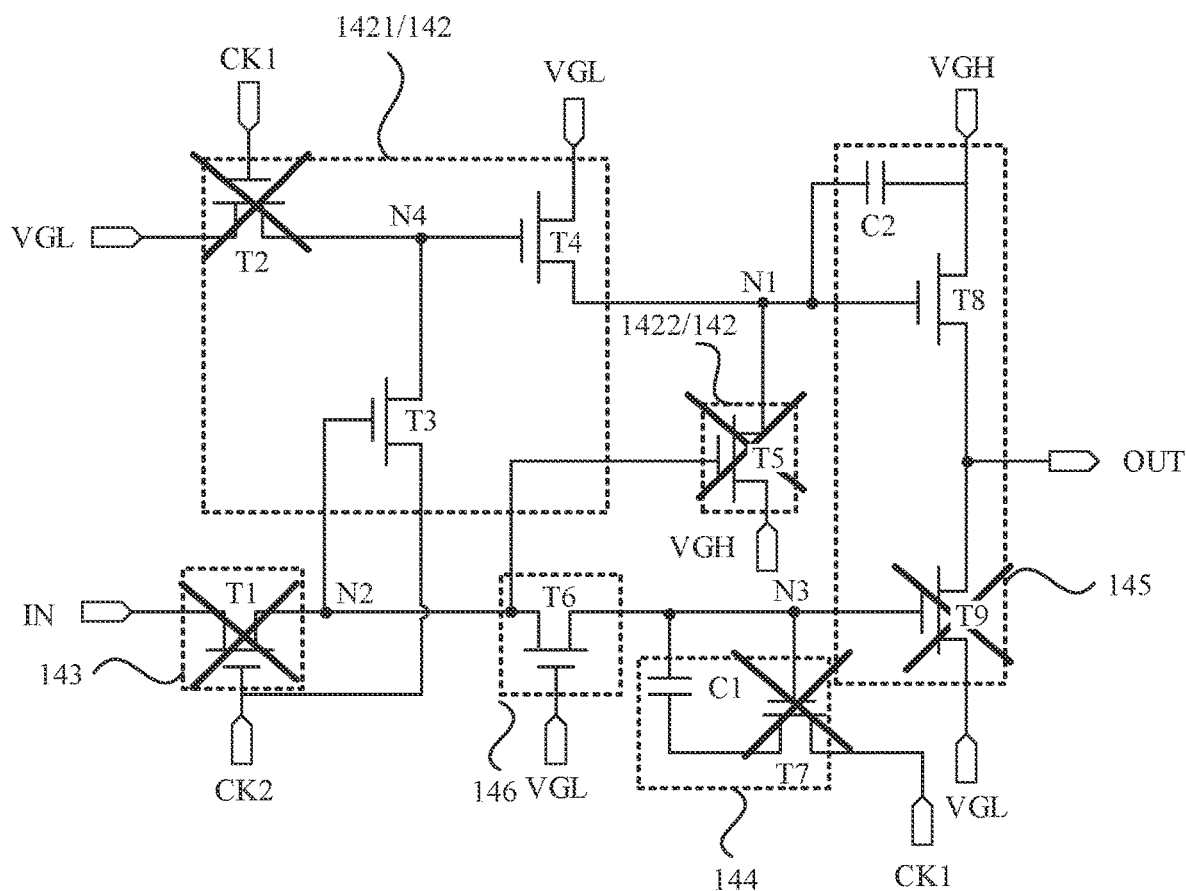
FIG. 11 is a diagram of a working process of another shift register according to an embodiment of this application.

In a second phase t2, namely, a phase in which the drive signal output end OUT outputs a high level, with reference to FIG. 11, CKV1 received by the first clock signal end CK1 changes from a high level to a low level, CKV2 received by the second clock signal end CK2 changes from a low level to a high level, and the first transistor T1 and the second transistor T2 are turned off. The third transistor T3 transmits the high level of CKV2 received by the second clock signal end CK2 to the fourth node N4, the fourth transistor T4 is turned on, the first node N1 is pulled low, the eighth transistor T8 is turned on, and the light emission control signal output by the drive signal output end OUT is at a high level. In addition, the third node N3 still remains at a high level, and the ninth transistor T9 is turned off.

Figure 12:
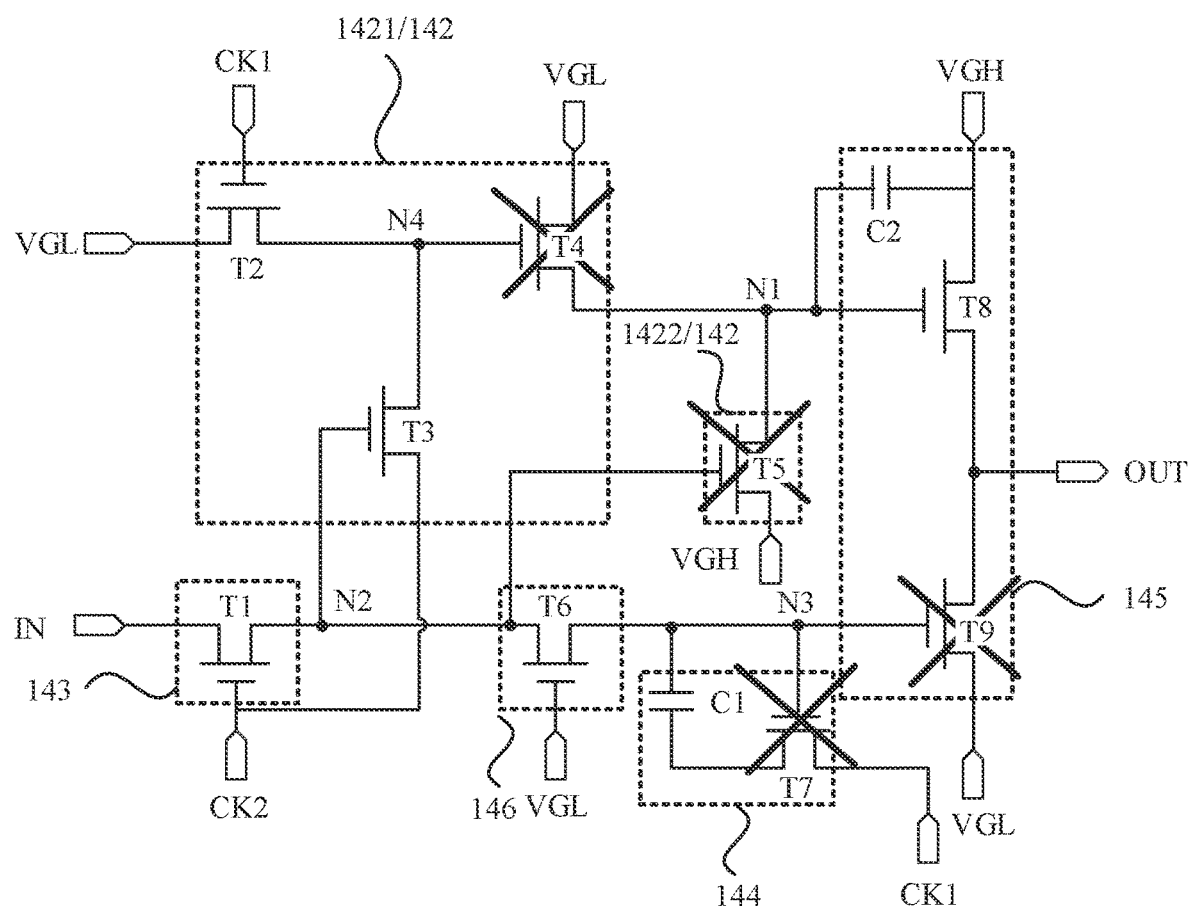
FIG. 12 is a diagram of a working process of another shift register according to an embodiment of this application.

In a third phase t3, namely, a phase of re-inputting the high level of STV, with reference to FIG. 12, CKV1 received by the first clock signal end CK1 changes from a low level to a high level, CKV2 received by the second clock signal end CK2 changes from a high level to a low level, the first transistor T1 is turned on, the sixth transistor T6 is turned on, the high level of the input signal STV received by the trigger signal input end IN is written to the third node N3, the third node N3 is pulled high, and the ninth transistor T9 is turned off. In addition, the fifth transistor T5 is turned off, the third transistor T3 is turned on, and the first node N1 cannot be set high by using the fifth transistor T5. Furthermore, at the high level of CKV1, the second transistor T2 is turned on, and the third transistor T3 transmits the low level of CKV2 to the fourth node N4. In this case, the fourth node N4 is in a low level state, and the fourth transistor T4 is turned off. Because of a holding function of the second capacitor C2, the first node N1 still remains at a low level, the eighth transistor T8 is turned on, and the light emission control signal output by the drive signal output end OUT remains at a high level.

Figure 13:
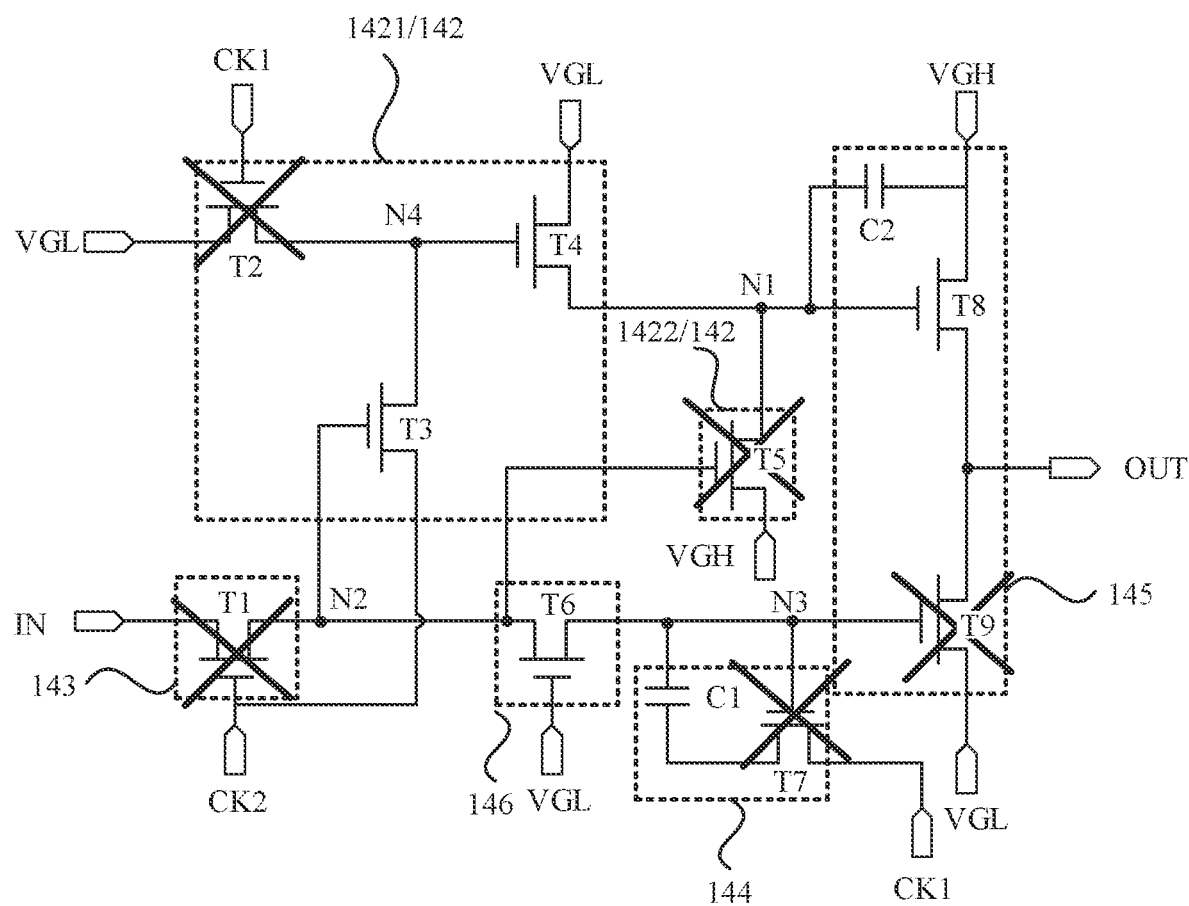
FIG. 13 is a diagram of a working process of another shift register according to an embodiment of this application.

In a fourth phase t4, namely, a phase of holding the high level output by the drive signal output end OUT, with reference to FIG. 13, CKV1 received by the first clock signal end CK1 changes from a high level to a low level, CKV2 received by the second clock signal end CK2 changes from a low level to a high level, and the first transistor T1 and the second transistor T2 are turned off. The third transistor T3 transmits the high level of CKV2 received by the second clock signal end CK2 to the fourth node N4, the fourth transistor T4 is turned on, the first node N1 is pulled low, the eighth transistor T8 is turned on, and the light emission control signal output by the drive signal output end OUT is at a high level. In addition, the third node N3 still remains at a high level, and the ninth transistor T9 is turned off.

Figure 14:
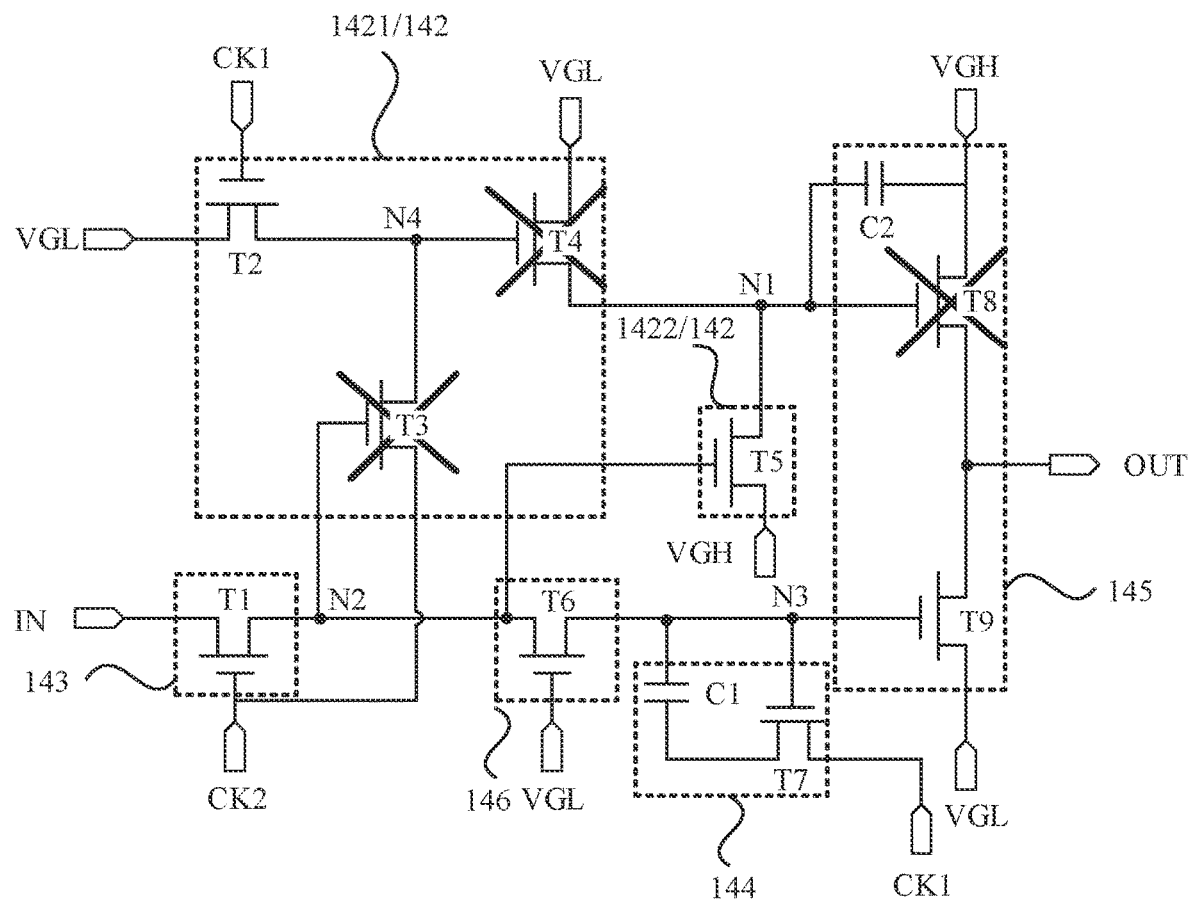
FIG. 14 is a diagram of a working process of another shift register according to an embodiment of this application.

In a fifth phase t5, namely, a phase of inputting a low level of STV, with reference to FIG. 14, CKV1 received by the first clock signal end CK1 changes from a low level to a high level, CKV2 received by the second clock signal end CK2 changes from a high level to a low level, the first transistor T1 is turned on, the sixth transistor T6 is turned on, the low level of the input signal STV received by the trigger signal input end IN is written to the third node N3, the third node N3 is pulled low, and the ninth transistor T9 is turned on. In addition, the third transistor T3 is turned off, the second transistor T2 is turned on, the fourth node N4 is at a low level, and the fourth transistor T4 is turned off. At the low level of the second node N2, the fifth transistor T5 is turned on, the first node N1 is pulled high, the eighth transistor T8 is turned off, and the light emission control signal output by the drive signal output end OUT is at a low level.

Figure 15:
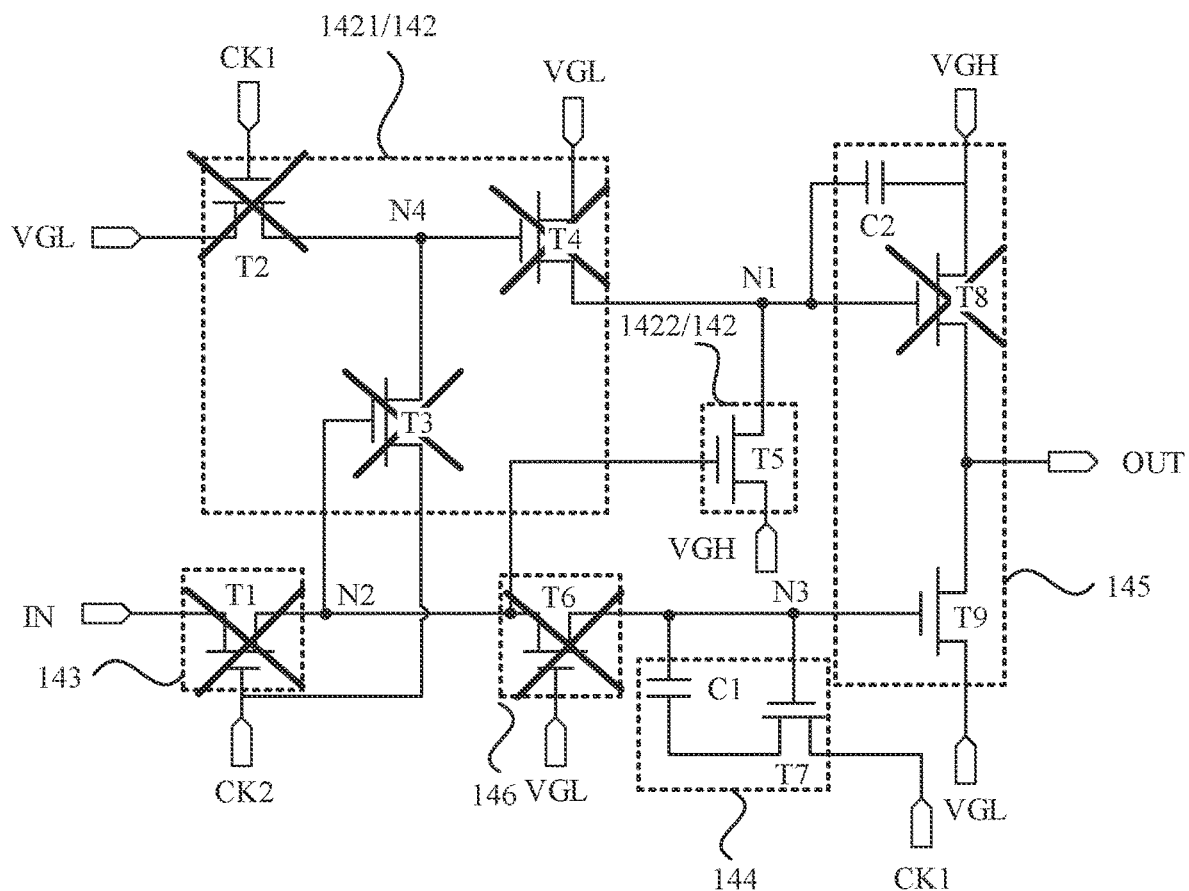
FIG. 15 is a diagram of a working process of another shift register according to an embodiment of this application.

In a sixth phase t6, namely, a capacitive coupling phase, with reference to FIG. 15, CKV1 received by the first clock signal end CK1 changes from a high level to a low level, CKV2 received by the second clock signal end CK2 changes from a low level to a high level, and the first transistor T1 and the second transistor T2 are turned off. The third node N3 remains at a low level, and the seventh transistor T7 is conducted. Due to a threshold loss of the ninth transistor T9, the ninth transistor T9 cannot exactly output a lowest level. When CKV1 received by the first clock signal end CKV1 jumps from a high level to a low level, the seventh transistor T7 and the first capacitor C1 pull the third node N3 to a potential less than the low level received by the first level signal receive end VGL. In this way, the ninth transistor T9 can output the low level received by the first level signal receive end VGL, that is, it is ensured that the light emission control signal output by the drive signal output end OUT is at the low level received by the first level signal receive end VGL.

The signal of the third node N3 is controlled by using the seventh transistor T7 and the first capacitor C1, so that when the light emission control signal output by the drive signal output end OUT is at a low level, the potential of the signal of the third node N3 is less than the potential of the low level received by the first level signal receive end VGL, and it is implemented that the light emission control signal output by the drive signal output end OUT is at the low level received by the first level signal receive end VGL. This avoids a case in which when the signal of the third node N3 is at a relatively high level, the low level received by the ninth transistor T9 from the first level signal receive end VGL cannot be transmitted to the control drive signal output end OUT, and consequently output of the light emission control signal is affected. In addition, the second transistor T2, the third transistor T3, and the fourth transistor T4 in the first control unit 1421 are all IGZO transistors (which have an advantage of a small leakage current). Therefore, when a low level is provided for the first node N1 by using the first control unit 1421, stability of the signal of the first node N1 can be ensured, and further it is ensured that the light emission control signal output by the drive signal output end OUT is relatively stable, to avoid occurrence of a screen-on case. Furthermore, a combination of the N-type transistor and the P-type transistor is used in the shift register ASG. Therefore, a quantity of thin film transistors required in the shift register ASG is effectively reduced, that is, the shift register ASG includes only nine transistors and two capacitors, so that there are a small quantity of structural units and devices, to facilitate a panel design with a narrower frame. Furthermore, a combination of the IGZO transistor and the LTPS transistor is used in the shift register ASG, and therefore the shift register ASG can have features such as a relatively strong driving capability and low power consumption. In addition, it is proven that the gate drive circuit can effectively avoid a disadvantage of electric leakage of the LTPS transistor.

In addition, because a threshold voltage of the LTPS transistor is prone to be affected by an external electric field, the threshold voltage is offset, and consequently signal output by the drive signal output end OUT is affected. It is proven that in the gate drive circuit including the IGZO transistor provided in this embodiment of this application, even if a threshold voltage offset of the LTPS transistor is relatively large (the threshold voltage offset is ∓2.5 V), the drive signal output end OUT may still output a relatively stable waveform, to provide a specific tolerance error for a process.

To describe the beneficial effect in detail, descriptions are provided below by performing comparison with a related technology.

Figure 16:
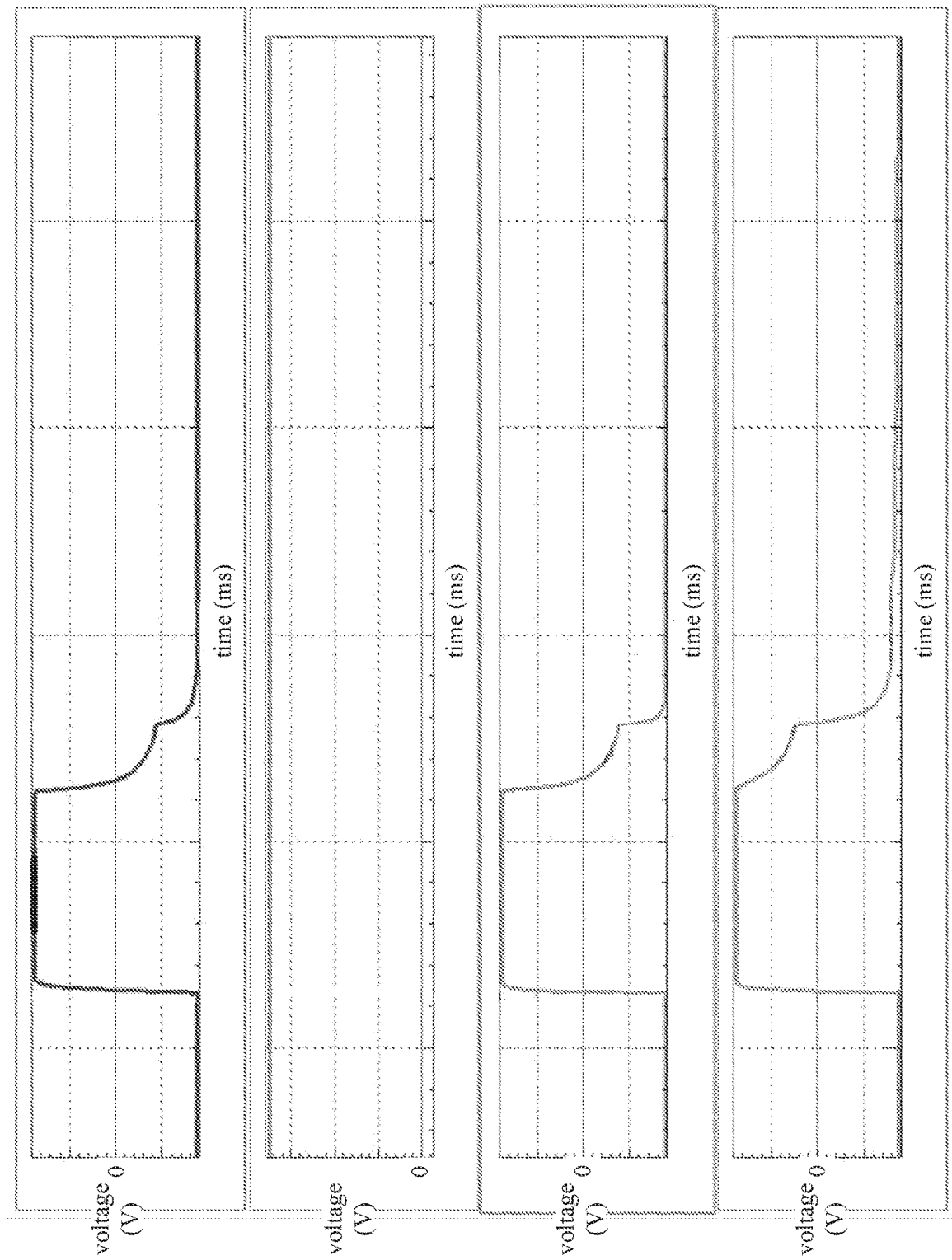
FIG. 16 is a simulation diagram of comparison between a related technology and an embodiment of this application.
Figure 17:
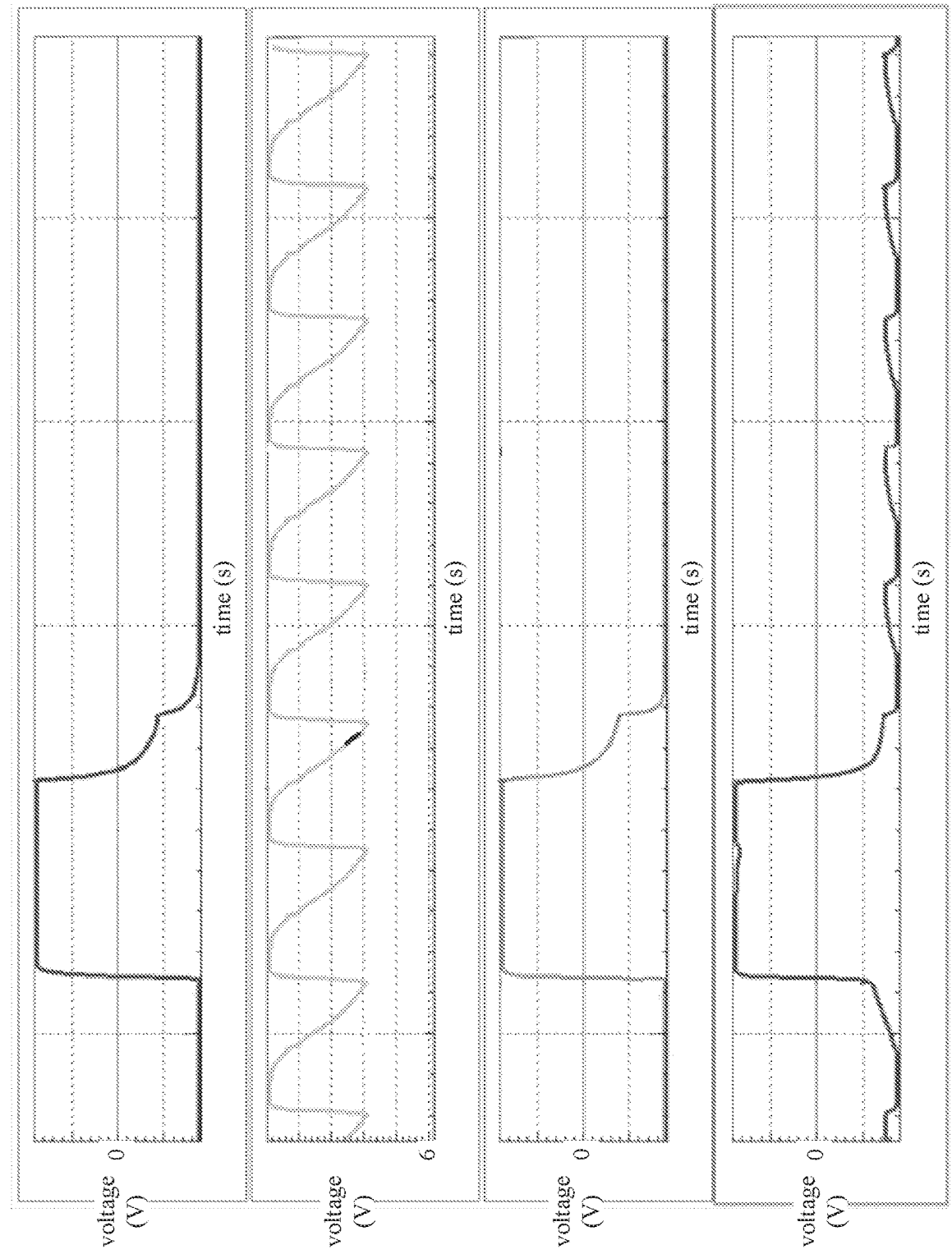
FIG. 17 is another simulation diagram of comparison between a related technology and an embodiment of this application.

FIG. 16 and FIG. 17 each are a simulation diagram of comparison between the related technology and this embodiment of this application. A horizontal coordinate is time, and a vertical coordinate is a signal output by the drive signal output end OUT during simulation.

From top to bottom, four simulation results in FIG. 16 are sequentially a signal of a drive signal output end OUT existing when a threshold voltage of an LTPS transistor in the related technology is offset by 0 V, a signal of the drive signal output end OUT existing when the threshold voltage of the LTPS transistor in the related technology is offset by −2.5 V, a signal of the drive signal output end OUT existing when the threshold voltage of the LTPS transistor in this embodiment of this application is offset by 0 V, and a signal of the drive signal output end OUT existing when the threshold voltage of the LTPS transistor in this embodiment of this application is offset by −2.5 V. It can be learned from FIG. 16 that when both the threshold voltage of the LTPS transistor in the related technology and the threshold voltage of the LTPS transistor in this embodiment of this application are offset by 0 V, both the signal output by the drive signal output end in the related technology and the signal output by the drive signal output end in this embodiment of this application are normal. However, when both the threshold voltage of the LTPS transistor in the related technology and the threshold voltage of the LTPS transistor in this embodiment of this application are offset by −2.5 V, the signal output in the related technology is abnormal, that is, a shift register in the related technology fails, and the signal output in this embodiment of this application is still normal.

From top to bottom, four simulation results in FIG. 17 are sequentially a signal of a drive signal output end OUT existing when a threshold voltage of an LTPS transistor in the related technology is offset by 0 V, a signal of the drive signal output end OUT existing when the threshold voltage of the LTPS transistor in the related technology is offset by 2.5 V, a signal of the drive signal output end OUT existing when the threshold voltage of the LTPS transistor in this embodiment of this application is offset by 0 V, and a signal of the drive signal output end OUT existing when the threshold voltage of the LTPS transistor in this embodiment of this application is offset by 2.5 V. It can be learned from FIG. 17 that when both the threshold voltage of the LTPS transistor in the related technology and the threshold voltage of the LTPS transistor in this embodiment of this application are offset by 0 V, both the signal output by the drive signal output end in the related technology and the signal output by the drive signal output end in this embodiment of this application are normal. However, when both the threshold voltage of the LTPS transistor in the related technology and the threshold voltage of the LTPS transistor in this embodiment of this application are offset by 2.5 V, the signal output in the related technology is abnormal, that is, a shift register in the related technology fails, and the signal output in this embodiment of this application is still relatively normal.

It can be learned that in the gate drive circuit including the IGZO transistor provided in this embodiment of this application, when the threshold voltage offset of the LTPS is ∓2.5 V, the circuit may still output a relatively stable waveform as a light emission control drive circuit, to provide a specific tolerance error for a process.

Descriptions are provided above by using characteristics of a batch of transistors as an example, to express that in this solution, a larger threshold voltage offset range can be tolerated, and there is higher tolerance for a process window. An actually tolerable offset value is not limited thereto.

Figure 18:
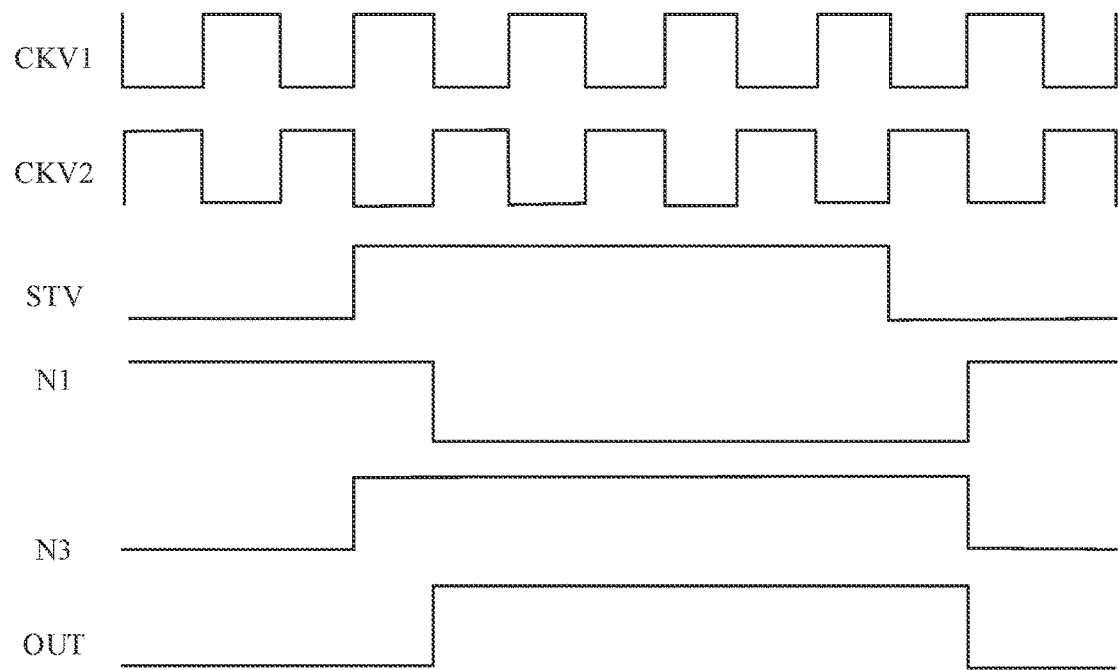
FIG. 18 is a schematic diagram of a time sequence in another shift register according to an embodiment of this application.

In addition, when the gate drive circuit is a light emission control drive circuit, the shift register ASG in the light emission control drive circuit supports pulse width modulation. For example, referring to FIG. 18, when a pulse width of the STV signal is 3.5 clock cycles, the light emission control signal output by the drive signal output end OUT is also 3.5 clock cycles.

The working process existing when the gate drive circuit is a first scan drive circuit is described below.

Figure 19:
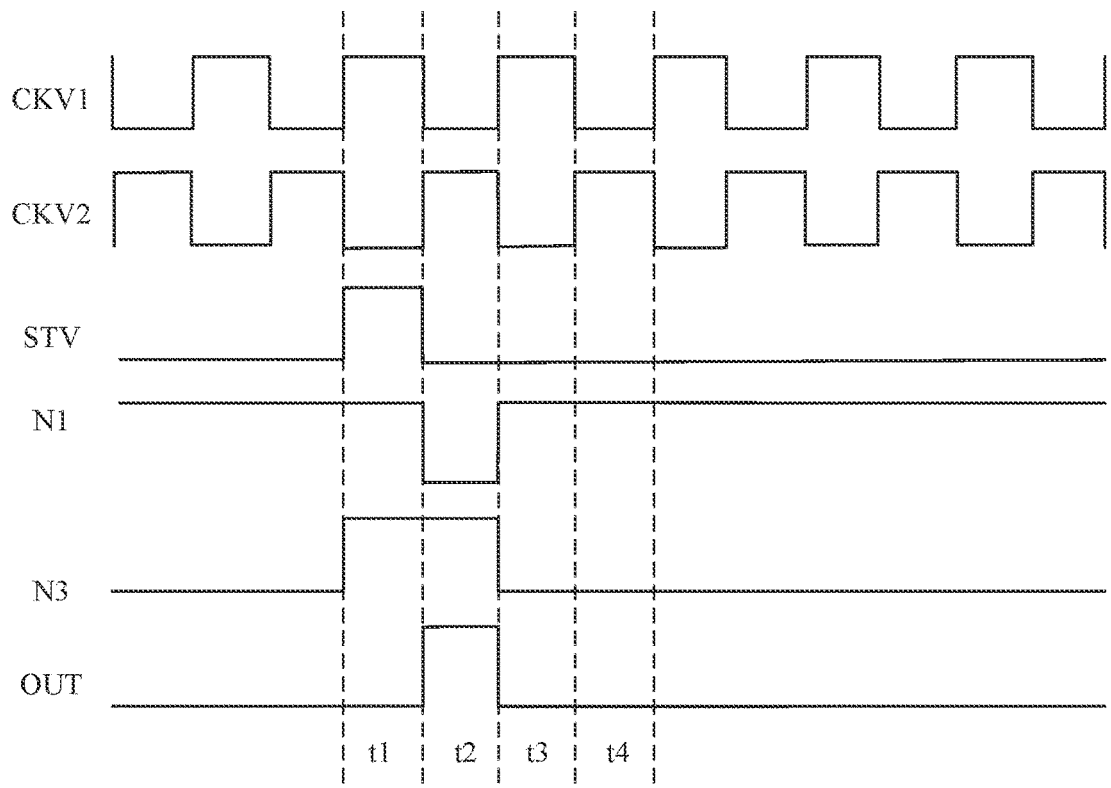
FIG. 19 is a schematic diagram of a time sequence in another shift register according to an embodiment of this application.

FIG. 19 is a diagram of a time sequence of signals in the shift register existing when the gate drive circuit is a first scan drive circuit. Compared with FIG. 9, a pulse width of the input signal STV has only half a cycle of the second clock signal CKV2. A working process of the shift register shown in FIG. 8 is described below with reference to the diagram of the time sequence of the signals in the shift register existing when the gate drive circuit is a first scan drive circuit. A time sequence of signals in a shift register of another structure is basically the same as this. Details are not described herein. Similarly, for example, the second transistor T2, the third transistor T3, and the fourth transistor T4 are N-type IGZO transistors, the first transistor T1, the fifth transistor T5, the sixth transistor T6, the seventh transistor T7, the eighth transistor T8, and the ninth transistor T9 are P-type LTPS transistors, the first level signal received by the first level signal receive end VGL is −7 V, and the second level signal received by the second level signal receive end VGH is 7 V.

In a first phase t1, namely, a phase of inputting a high level of STV, with reference to FIG. 10, CKV1 received by the first clock signal end CK1 changes from a low level to a high level, CKV2 received by the second clock signal end CK2 changes from a high level to a low level, the first transistor T1 is turned on, the sixth transistor T6 is turned on, the high level of the input signal STV received by the trigger signal input end IN is written to the third node N3, the third node N3 is pulled high, and the ninth transistor T9 is turned off. In addition, the fifth transistor T5 is turned off, the third transistor T3 is turned on, and the first node N1 cannot be set high by using the fifth transistor T5. Furthermore, at the high level of CKV1, the second transistor T2 is turned on, and the third transistor T3 transmits the low level of CKV2 to the fourth node N4. In this case, the fourth node N4 is in a low level state, the fourth transistor T4 is turned off, and the first node N1 still remains at a high level. Because of a holding function of the second capacitor C2, the light emission control signal output by the drive signal output end OUT is still at a low level in this case.

In a second phase t2, namely, a phase in which the drive signal output end OUT outputs a high level, with reference to FIG. 11, CKV1 received by the first clock signal end CK1 changes from a high level to a low level, CKV2 received by the second clock signal end CK2 changes from a low level to a high level, and the first transistor T1 and the second transistor T2 are turned off. The third transistor T3 transmits the high level of CKV2 received by the second clock signal end CK2 to the fourth node N4, the fourth transistor T4 is turned on, the first node N1 is pulled low, the eighth transistor T8 is turned on, and the light emission control signal output by the drive signal output end OUT is at a high level. In addition, the third node N3 still remains at a high level, and the ninth transistor T9 is turned off.

In a third phase t3, namely, a phase of inputting a low level of STV, with reference to FIG. 14, CKV1 received by the first clock signal end CK1 changes from a low level to a high level, CKV2 received by the second clock signal end CK2 changes from a high level to a low level, the first transistor T1 is turned on, the sixth transistor T6 is turned on, the low level of the input signal STV received by the trigger signal input end IN is written to the third node N3, the third node N3 is pulled low, and the ninth transistor T9 is turned on. In addition, the third transistor T3 is turned off, the second transistor T2 is turned on, the fourth node N4 is at a low level, and the fourth transistor T4 is turned off. At the low level of the second node N2, the fifth transistor T5 is turned on, the first node N1 is pulled high, the eighth transistor T8 is turned off, and the light emission control signal output by the drive signal output end OUT is at a low level.

In a sixth phase t6, namely, a capacitive coupling phase, with reference to FIG. 15, CKV1 received by the first clock signal end CK1 changes from a high level to a low level, CKV2 received by the second clock signal end CK2 changes from a low level to a high level, and the first transistor T1 and the second transistor T2 are turned off. The third node N3 remains at a low level, and the seventh transistor T7 is conducted. Due to a threshold loss of the ninth transistor T9, the ninth transistor T9 cannot exactly output a lowest level. When CKV1 received by the first clock signal end CKV1 jumps from a high level to a low level, the seventh transistor T7 and the first capacitor C1 pull the third node N3 to a potential less than the low level received by the first level signal receive end VGL. In this way, the ninth transistor T9 can output the low level received by the first level signal receive end VGL, that is, it is ensured that the light emission control signal output by the drive signal output end OUT is at the low level received by the first level signal receive end VGL.

The signal of the third node N3 is controlled by using the seventh transistor T7 and the first capacitor C1, so that when the first scan signal output by the drive signal output end OUT is at a low level, the potential of the signal of the third node N3 is less than the potential of the low level received by the first level signal receive end VGL, and it is implemented that the first scan signal output by the drive signal output end OUT is at the low level received by the first level signal receive end VGL. This avoids a case in which when the signal of the third node N3 is at a relatively high level, the low level received by the ninth transistor T9 from the first level signal receive end VGL cannot be transmitted to the control drive signal output end OUT, and consequently output of the first scan signal is affected. In addition, the second transistor T2, the third transistor T3, and the fourth transistor T4 in the first control unit 1421 are all IGZO transistors (which have an advantage of a small leakage current). Therefore, when a low level is provided for the first node N1 by using the first control unit 1421, stability of the signal of the first node N1 can be ensured, and further it is ensured that the first scan signal output by the drive signal output end OUT is relatively stable, to ensure normal working of the pixel circuit 111. Furthermore, a combination of the N-type transistor and the P-type transistor is used in the shift register ASG. Therefore, a quantity of thin film transistors required in the shift register ASG is effectively reduced, that is, the shift register ASG includes only nine transistors and two capacitors, so that there are a small quantity of structural units and devices, to facilitate a panel design with a narrower frame. Furthermore, a combination of the IGZO transistor and the LTPS transistor is used in the shift register ASG, and therefore the shift register ASG can have features such as a relatively strong driving capability and low power consumption. In addition, it is proven that the gate drive circuit can effectively avoid a disadvantage of electric leakage of the LTPS transistor.

In addition, because a threshold voltage of the LTPS transistor is prone to be affected by an external electric field, the threshold voltage is offset, and consequently signal output by the drive signal output end OUT is affected. It is proven that in the gate drive circuit including the IGZO transistor provided in this embodiment of this application, even if a threshold voltage offset of the LTPS transistor is relatively large (the threshold voltage offset is $\mp 2.5$ V), the drive signal output end OUT may still output a relatively stable waveform, to provide a specific tolerance error for a process.

To describe the beneficial effect in detail, descriptions are provided below by performing comparison with a related technology.

Figure 20:
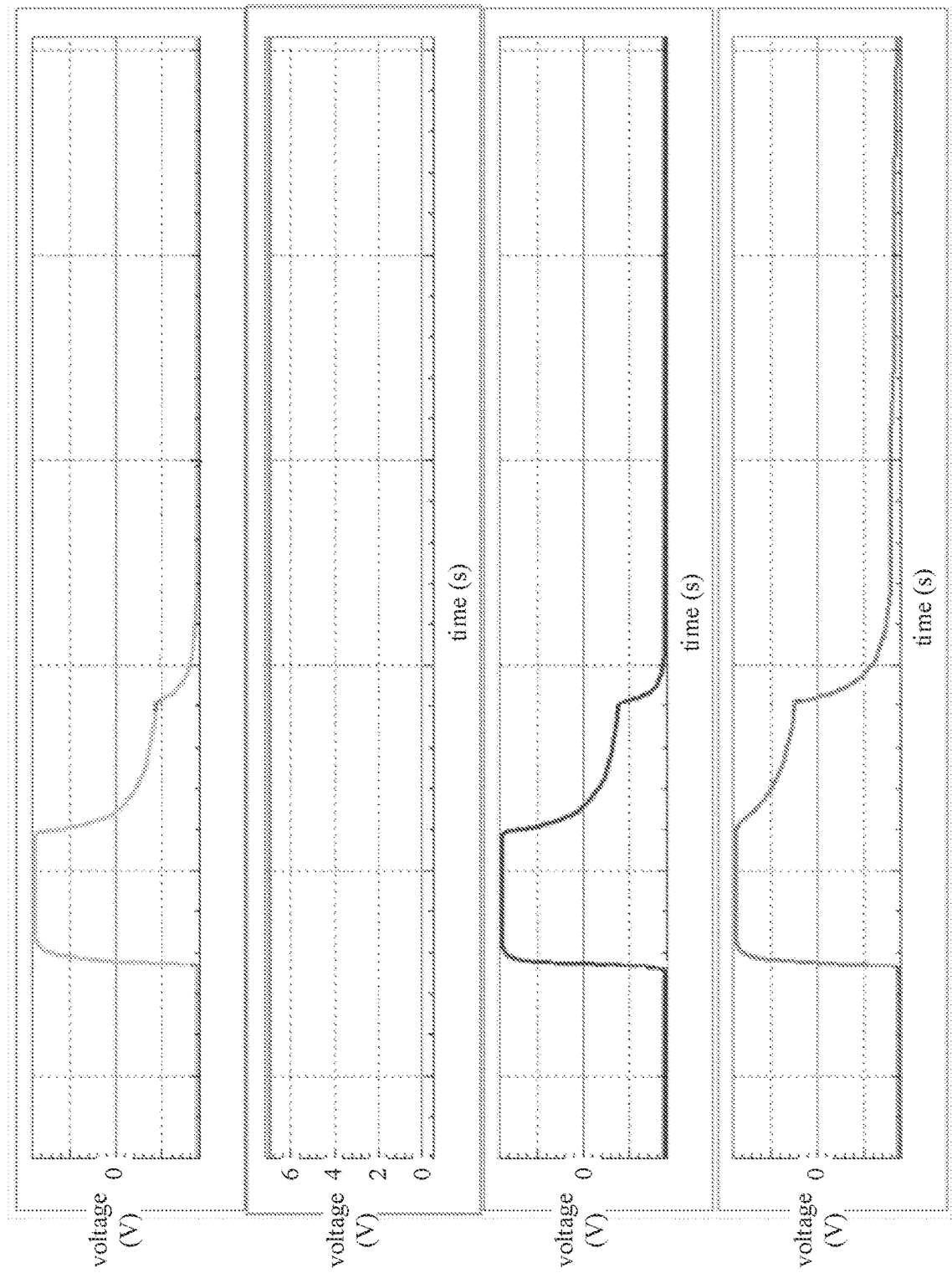
FIG. 20 is another simulation diagram of comparison between a related technology and an embodiment of this application.

FIG. 20 is a simulation diagram of comparison between the related technology and this embodiment of this application. A horizontal coordinate is time, and a vertical coordinate is a signal output by the drive signal output end OUT during simulation.

From top to bottom, four simulation results in FIG. 20 are sequentially a signal of a drive signal output end OUT existing when a threshold voltage of an LTPS transistor in the related technology is offset by 0 V, a signal of the drive signal output end OUT existing when the threshold voltage of the LTPS transistor in the related technology is offset by −2.5 V, a signal of the drive signal output end OUT existing when the threshold voltage of the LTPS transistor in this embodiment of this application is offset by 0 V, and a signal of the drive signal output end OUT existing when the threshold voltage of the LTPS transistor in this embodiment of this application is offset by −2.5 V. It can be learned from FIG. 20 that when both the threshold voltage of the LTPS transistor in the related technology and the threshold voltage of the LTPS transistor in this embodiment of this application are offset by 0 V, both the signal output by the drive signal output end in the related technology and the signal output by the drive signal output end in this embodiment of this application are normal. However, when both the threshold voltage of the LTPS transistor in the related technology and the threshold voltage of the LTPS transistor in this embodiment of this application are offset by −2.5 V, the signal output in the related technology is abnormal, that is, a shift register in the related technology fails, and the signal output in this embodiment of this application is still normal.

It can be learned that in the gate drive circuit including the IGZO transistor provided in this embodiment of this application, when the threshold voltage offset of the LTPS is $\mp 2.5$ V, the circuit may still output a relatively stable waveform as a first scan drive circuit, to provide a specific tolerance error for a process.

Descriptions are provided above by using characteristics of a batch of transistors as an example, to express that in this solution, a larger threshold voltage offset range can be tolerated, and there is higher tolerance for a process window. An actually tolerable offset value is not limited thereto.

Similarly, when the gate drive circuit is a first scan drive circuit, the shift register ASG in the first scan drive circuit supports pulse width modulation.

The foregoing embodiments are merely intended to describe the technical solutions in this application, but not intended to limit this application. Although this application is described in detail with reference to the foregoing embodiments, persons of ordinary skill in the art should understand that they may still make modifications to the technical solutions described in the foregoing embodiments or make equivalent replacements to some technical features thereof. However, these modifications or replacements do not make the essence of the corresponding technical solutions depart from the scope of the technical solutions in the embodiments of this application.

What is claimed is:

1. A shift register, comprising:
   a node control circuit, electrically connected to a first level signal receive end, a second level signal receive end, a first clock signal end, a second clock signal end, a first node, and a second node;
   an input circuit, electrically connected to the second clock signal end, a trigger signal input end, and the second node;
   a voltage regulator circuit, electrically connected to the second node, the second clock signal end, and a third node; and
   an output circuit, electrically connected to the first level signal receive end, the second level signal receive end, the first node, the third node, and a drive signal output end;
   wherein the input circuit is configured to receive an input signal of the trigger signal input end, and control a signal of the second node in response to a second clock signal received by the second clock signal end;
   wherein the node control circuit is configured to receive a first level signal received by the first level signal receive end and a second level signal received by the second level signal receive end, and control a signal of the first node in response to the signal of the second node, a first clock signal received by the first clock signal end, and the second clock signal received by the second clock signal end;

wherein the output circuit is configured to:
 receive the second level signal received by the second level signal receive end, and control, in response to the signal of the first node, a signal output by the drive signal output end; or
 receive the first level signal of the first level signal receive end, and control, in response to a signal of the third node, a signal output by the drive signal output end;

wherein the voltage regulator circuit is configured to receive the signal of the second node, and control the signal of the third node in response to the second clock signal received by the second clock signal end;

wherein the first level signal is a low level signal, the second level signal is a high level signal, and when the signal output by the drive signal output end is a low level signal, a potential of the signal of the third node is less than a potential of the first level signal received by the first level signal receive end;

wherein the node control circuit comprises at least one transistor whose active layer is an oxide semiconductor, and at least one of the input circuit, the voltage regulator circuit, or the output circuit comprises at least one transistor whose active layer is silicon;

wherein the voltage regulator circuit comprises a seventh transistor and a first capacitor; and wherein a gate of the seventh transistor is electrically connected to the third node, a first electrode of the seventh transistor is electrically connected to the first clock signal end, a second electrode of the seventh transistor is electrically connected to a second electrode of the first capacitor, and a first electrode of the first capacitor is separately electrically connected to the third node and the second node.

2. The shift register according to claim 1, wherein the node control circuit comprises:
 a first control circuit, electrically connected to the first level signal receive end, the first clock signal end, the second clock signal end, the first node, and the second node; and
 a second control circuit, electrically connected to the second level signal receive end, the first node, and the second node;
 wherein:
  the first control circuit is configured to: receive the first level signal of the first level signal receive end, and control the signal of the first node in response to the signal of the second node, the first clock signal received by the first clock signal end, and the second clock signal received by the second clock signal end; or
  the second control circuit is configured to: receive the second level signal received by the second level signal receive end, and control the signal of the first node in response to the signal of the second node.

3. The shift register according to claim 2, wherein the first control circuit comprises at least one transistor whose active layer is an oxide semiconductor.

4. The shift register according to claim 3, wherein the first control circuit comprises a second transistor, a third transistor, and a fourth transistor;

wherein a gate of the second transistor is electrically connected to the first clock signal end, a first electrode of the second transistor is electrically connected to the first level signal receive end, and a second electrode of the second transistor, a gate of the fourth transistor, and a second electrode of the third transistor are coupled to a fourth node;

wherein a gate of the third transistor is electrically connected to the second node, and a first electrode of the third transistor is electrically connected to the second clock signal end; and wherein a first electrode of the fourth transistor is electrically connected to the first level signal receive end, and a second electrode of the fourth transistor is electrically connected to the first node.

5. The shift register according to claim 4, wherein the second transistor, the third transistor, and the fourth transistor are all transistors whose active layers are oxide semiconductors.

6. The shift register according to claim 2,
wherein the second control circuit comprises a fifth transistor; and
wherein a gate of the fifth transistor is electrically connected to the second node, a first electrode of the fifth transistor is electrically connected to the second level signal receive end, and a second electrode of the fifth transistor is electrically connected to the first node.

7. The shift register according to claim 1, wherein the shift register further comprises:
 a protection circuit, located between the second node and the third node and between the second node and the voltage regulator circuit, and electrically connected to the first level signal receive end, wherein the protection circuit is configured to prevent the signal of the third node from being transmitted to the second node.

8. The shift register according to claim 7,
wherein the protection circuit comprises a sixth transistor; and
wherein a first electrode of the sixth transistor is electrically connected to the second node, a gate of the sixth transistor is electrically connected to the first level signal receive end, and a second electrode of the sixth transistor is separately electrically connected to the third node and the voltage regulator circuit.

9. The shift register according to claim 1,
wherein the input circuit comprises a first transistor; and
wherein a gate of the first transistor is electrically connected to the second clock signal end, a first electrode of the first transistor is electrically connected to the trigger signal input end, and a second electrode of the first transistor is electrically connected to the second node.

10. The shift register according to claim 1,
wherein the output circuit comprises a second capacitor, an eighth transistor, and a ninth transistor; and
wherein both a gate of the eighth transistor and a first electrode of the second capacitor are electrically connected to the first node, both a first electrode of the eighth transistor and a second electrode of the second capacitor are electrically connected to the second level signal receive end, both a second electrode of the eighth transistor and a second electrode of the ninth transistor are electrically connected to the drive signal output end, a gate of the ninth transistor is electrically connected to the third node, and a first electrode of the ninth transistor is electrically connected to the first level signal receive end.

11. The shift register according to claim 1, wherein the transistor whose active layer is an oxide semiconductor is an N-type transistor, and the transistor whose active layer is silicon is a P-type transistor.

12. A gate drive circuit, comprising N mutually cascaded shift registers, wherein N≥2, and wherein each shift register of the N mutually cascaded shift registers comprises:
- a node control circuit, electrically connected to a first level signal receive end, a second level signal receive end, a first clock signal end, a second clock signal end, a first node, and a second node;
- an input circuit, electrically connected to the second clock signal end, a trigger signal input end, and the second node;
- a voltage regulator circuit, electrically connected to the second node, the second clock signal end, and a third node; and
- an output circuit, electrically connected to the first level signal receive end, the second level signal receive end, the first node, the third node, and a drive signal output end;
- wherein the input circuit is configured to receive an input signal of the trigger signal input end, and control a signal of the second node in response to a second clock signal received by the second clock signal end;
- wherein the node control circuit is configured to receive a first level signal received by the first level signal receive end and a second level signal received by the second level signal receive end, and control a signal of the first node in response to the signal of the second node, a first clock signal received by the first clock signal end, and the second clock signal received by the second clock signal end;
- wherein the output circuit is configured to:
  - receive the second level signal received by the second level signal receive end, and control, in response to the signal of the first node, a signal output by the drive signal output end; or
  - receive the first level signal of the first level signal receive end, and control, in response to a signal of the third node, a signal output by the drive signal output end;
- wherein the voltage regulator circuit is configured to receive the signal of the second node, and control the signal of the third node in response to the second clock signal received by the second clock signal end;
- wherein the first level signal is a low level signal, the second level signal is a high level signal, and when the signal output by the drive signal output end is a low level signal, a potential of the signal of the third node is less than a potential of the first level signal received by the first level signal receive end;
- wherein the node control circuit comprises at least one transistor whose active layer is an oxide semiconductor, and at least one of the input circuit, the voltage regulator circuit, or the output circuit comprises at least one transistor whose active layer is silicon;
- wherein the voltage regulator circuit comprises a seventh transistor and a first capacitor; and
- wherein a gate of the seventh transistor is electrically connected to the third node, a first electrode of the seventh transistor is electrically connected to the first clock signal end, a second electrode of the seventh transistor is electrically connected to a second electrode of the first capacitor, and a first electrode of the first capacitor is separately electrically connected to the third node and the second node.

13. A display panel, comprising at least one gate drive circuit according to claim 12.

14. The display panel according to claim 13, comprising at least two gate drive circuits,
- wherein one gate drive circuit is a light emission control drive circuit, and the other gate drive circuit is a scan drive circuit; and
- wherein a clock signal line electrically connected to the light emission control drive circuit is multiplexed as a clock signal line of the scan drive circuit.

* * * * *